United States Patent
Hu et al.

(10) Patent No.: US 11,897,364 B1
(45) Date of Patent: Feb. 13, 2024

(54) BATTERY MODEL CALIBRATION

(71) Applicant: Rivian IP Holdings, LLC, Plymouth, MI (US)

(72) Inventors: Yang Hu, Irvine, CA (US); Rutooj Deelip Deshpande, Irvine, CA (US); Cuong Cao Nguyen, Aliso Viejo, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 0 days.

(21) Appl. No.: 18/067,762

(22) Filed: Dec. 19, 2022

(51) Int. Cl.
*B60L 58/12* (2019.01)
*G01R 31/374* (2019.01)
*G01R 31/36* (2020.01)
*G01R 31/367* (2019.01)

(52) U.S. Cl.
CPC ............ *B60L 58/12* (2019.02); *G01R 31/367* (2019.01); *G01R 31/3646* (2019.01); *G01R 31/374* (2019.01)

(58) Field of Classification Search
CPC ............................. B60L 58/12; G01R 31/3646
USPC .......................................................... 702/63
See application file for complete search history.

(56) References Cited

U.S. PATENT DOCUMENTS 10,752,126 B1 * 8/2020 Zhang ................. H01M 50/569
11,156,668 B2 10/2021 Zhang et al.
2015/0355283 A1 * 12/2015 Lee ..................... G01R 31/3835
702/63
2020/0185792 A1 * 6/2020 Wampler, II ...... H01M 10/0525
2021/0237614 A1 * 8/2021 Yao ........................... G06N 3/08
2021/0280920 A1 * 9/2021 Rinaldo ................ G01R 31/44

OTHER PUBLICATIONS

Jussi Sihvo et al., "Novel Fitting Algorithm for Parametrization of Equivalent Circuit Model of Li-Ion Battery From Broadband Impedance Measurements," IEEE Transactions on Industrial Electronics, Jun. 2021, pp. 4916-4926, vol. 68, No. 6, doi: 10.1109/TIE.2020.2988235.
Ning Tian et al., "On parameter identification of an equivalent circuit model for lithium-ion batteries," IEEE Conference on Control Technology and Applications (CCTA), Aug. 27, 2017, pp. 187-192, Kohala Coast, Hawai'i, USA, doi: 10.1109/CCTA.2017.8062461.

(Continued)

*Primary Examiner* — Ricky Go
(74) *Attorney, Agent, or Firm* — Foley & Lardner LLP

(57) ABSTRACT

The present solution provides calibration for a battery model of an electric vehicle battery. One or more processors of an electric vehicle coupled with memory can identify, for the electric vehicle, a model configured to determine performance of a battery of the electric vehicle based on a function. The function can generate values for a parameter of the model across a range of states of charges and a range of temperatures. The one or more processors can generate, based on input from a sensor of the electric vehicle, a value of performance of the electric vehicle via the model. The one or more processors can provide an action for the electric vehicle based on the value of the performance.

20 Claims, 20 Drawing Sheets

(56) References Cited

OTHER PUBLICATIONS

Shuang Kou et al., "Parameter Identification of Battery Model Based on Forgetting Factor Recursive Least Square Method" IEEE 4th Information Technology and Mechatronics Engineering Conference (ITOEC), Dec. 14, 2018, pp. 1712-1715, Chongqing, China, doi: 10.1109/ITOEC.2018.8740487.

W.D. Widanage et al., "Design and use of multisine signals for Li-ion battery equivalentcircuit modelling. Part 1: Signal design," Journal of Power Sources, Aug. 30, 2016, pp. 70-78, vol. 324, No. 0378-7753, Science Direct. https://doi.org/10.1016/j.jpowsour.2016.05.015.

Xiaosong Hu et al., "A comparative study of equivalent circuit models for Li-ion batteries," Journal of Power Sources, Jan. 15, 2012, pp. 359-367, vol. 198, No. 0378-7753, Science Direct. https://doi.org/10.1016/j.jpowsour.2011.10.013.

\* cited by examiner

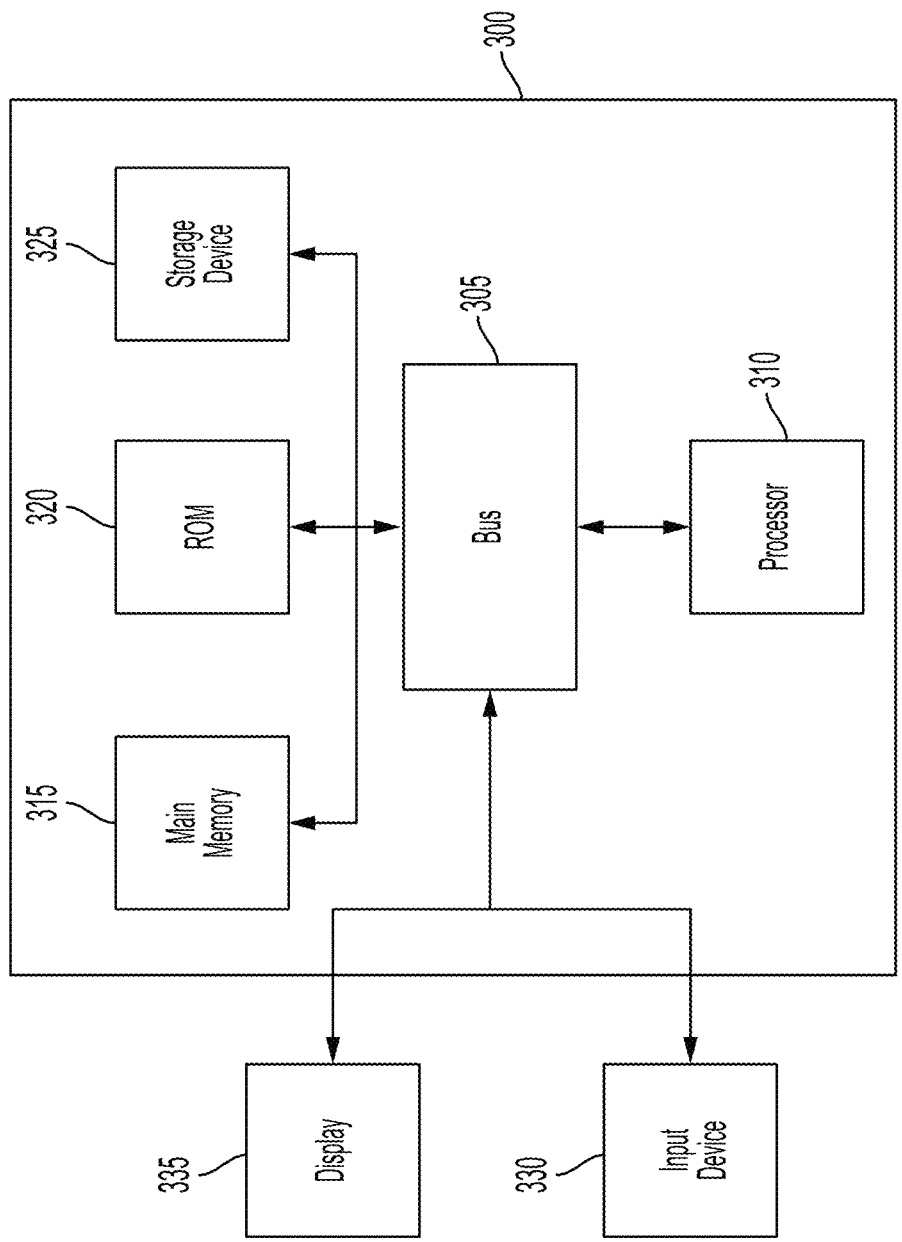

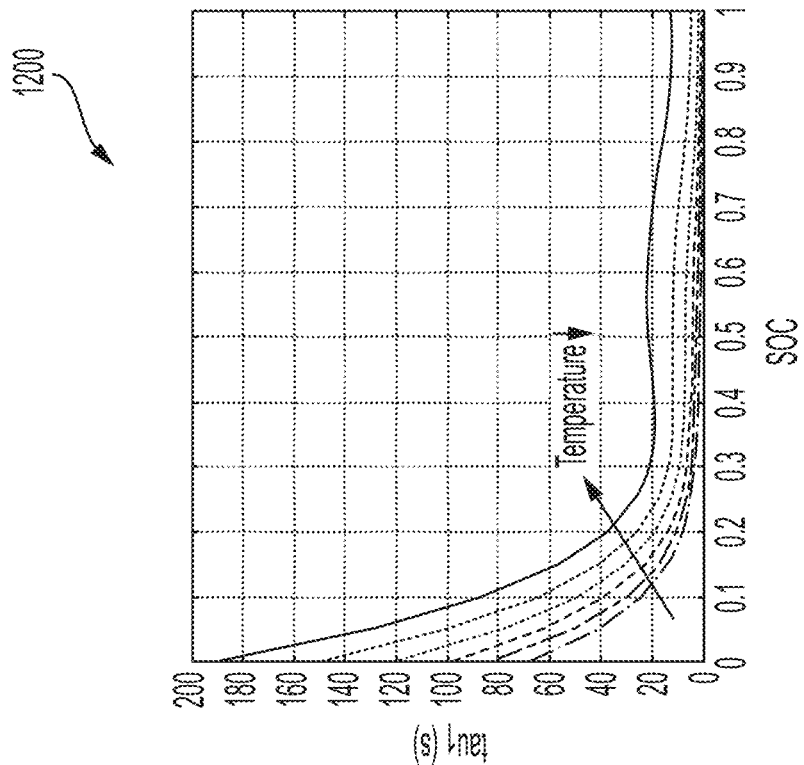
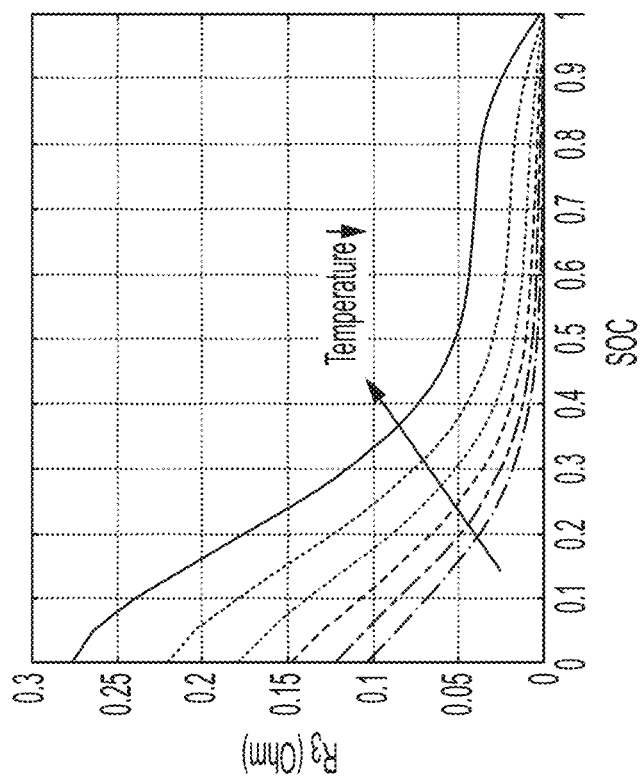
FIG. 12 B

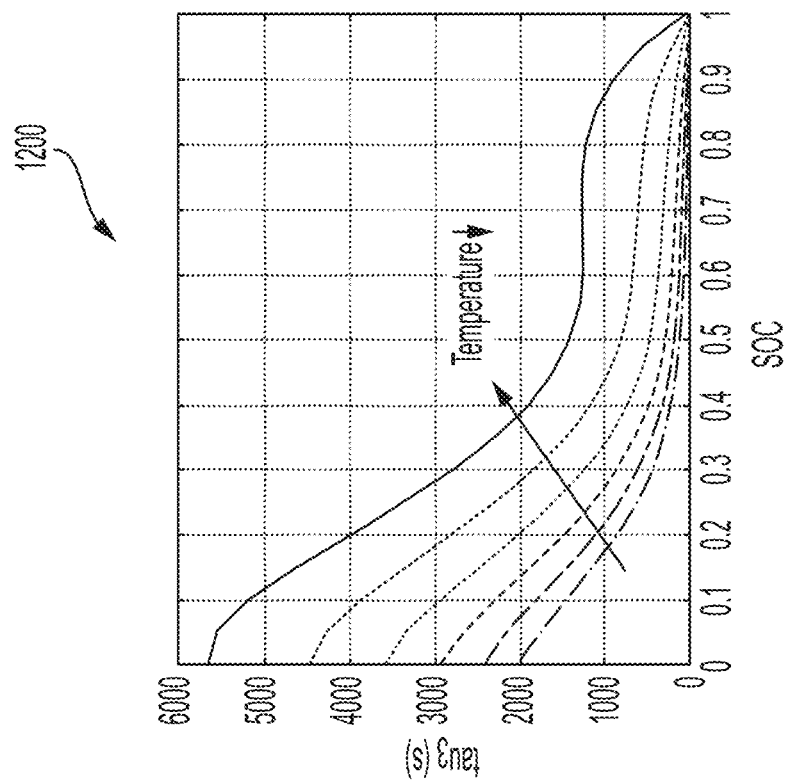
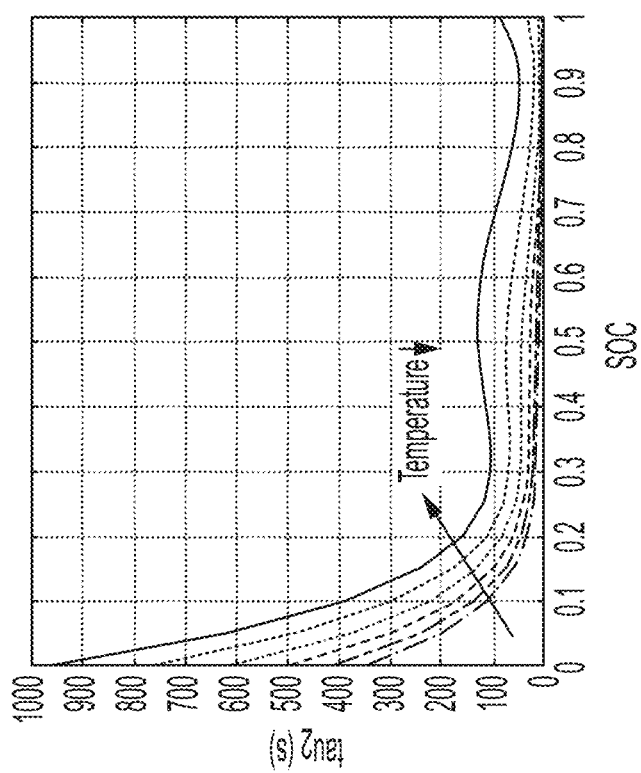
FIG. 12C

BATTERY MODEL CALIBRATION

INTRODUCTION

Electric vehicles (EVs) can be powered using batteries that store energy. EV batteries can be managed using systems monitoring operation of the battery. The energy storage and consumption can vary based on usage and external conditions.

SUMMARY

The present solution is relates to providing a calibration for a battery model of an electric vehicle. Equivalent circuit (EQC) models can be used for simulating performance of batteries in EVs, including their state of charge (SOC), state of power (SOP), and state of energy (SOE). EQC models can include a limited number of parameters that can include a series of resistance and capacitance, which can be functions of SOCs and temperatures. When calibrating a model that can identify the parameters at discrete SOC or temperature set points by types of curve fitting or optimization approaches, three possible main drawbacks can include: (1) non-smooth parameter distribution that induces error for interpolation, (2) no physical principle considered for temperature dependency, and (3) time-consuming calibration. It can be challenging to calibrate battery models without introducing discontinuities across the SOC and temperature range, which can cause inaccurate performance estimates or inefficient battery management. The present solution provides a global calibration approach that can identify the parameters of the EQC models of lithium-ion batteries across different state of charges (SOCs) and temperatures simultaneously. The present solution can use a pre-defined parameter-dependency structure, where the values of the parameters can be expressed as smoothed functions of SOCs, and the temperature effects are governed by the Arrhenius equation. The results can include smoothed parameter mappings that can be effectively used in the EQC models with improved model reliability and continuity across the SOC and temperature range.

At least one aspect is directed to a system. The system can include one or more processors of an electric vehicle coupled with memory. The one or more processors can identify, for the electric vehicle, a model. The model can be configured to determine performance of a battery of the electric vehicle based on a function. The function can generate values for a parameter of the model across a range of states of charges and a range of temperatures. The one or more processors can generate, based on input from a sensor of the electric vehicle, a value of performance of the electric vehicle via the model. The one or more processors can provide an action for the electric vehicle based on the value of the performance.

At least one aspect is directed to a method. The method can identify, by a data processing system comprising one or more processors coupled with memory, a parameter of a model. The parameter of the model can be used to determine a performance of a battery via the model. The method can include calibrating, by the data processing system, the model based on a function. The function can generate values for the parameter of the model across a range of states of charges and a range of temperatures. The method can include providing, by the data processing system, the model calibrated for the battery to cause the model to determine the performance responsive to input.

At least one aspect is directed to a non-transitory computer-readable medium comprising instructions. The instructions, when executed by one or more processors, can cause the one or more processors to identify a parameter of a model used to determine a performance of a battery via the model. The instructions can cause the one or more processors to calibrate the model based on a function. The function can generate values for the parameter of the model across a range of states of charges and a range of temperatures. The instructions can cause the one or more processors to provide the model calibrated for the battery to cause the model to determine the performance responsive to input.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. The foregoing information and the following detailed description and drawings include illustrative examples and should not be considered as limiting.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIG. 3 is a block diagram illustrating an architecture for a computer system that can be employed to implement elements of the systems and methods described and illustrated herein.

FIGS. 12A, 12B and 12C (referred herein also as "FIG. 12") depict graphs of calibrated Rx parameters and RC Pair parameters of an example model of an electric vehicle.

DETAILED DESCRIPTION

Following below are more detailed descriptions of various concepts related to, and implementations of, methods, apparatuses, and systems of implementing a global calibration on a model of a battery, such as a battery of an electric vehicle. The various concepts introduced above and discussed in greater detail below may be implemented in any of numerous ways.

The present solution is generally directed to a solution for providing a global calibration for a battery model of an electric vehicle. An example of a battery model can include an equivalent circuit (EQC) model which can be used for simulating performance of batteries in EVs, including their state of charge (SOC), state of power (SOP), and state of energy (SOE). EQC models can include a limited number of parameters that can include a series of resistance and capacitance, which can be functions of SOCs and temperatures. When calibrating such models, common calibration methods can identify the parameters at discrete SOC or temperature set points by types of curve fitting or optimization approaches, which has three main drawbacks: (1) non-smooth parameter distribution that induces error for interpolation, (2) no physical principle considered for temperature dependency, and (3) time-consuming calibration. As a result, the models calibrated using such methods often produce results that are discontinuous across the SOC and temperature range, whereas the temperature and SOC changes are continuous in the real batteries, indicating that these calibration methods are inaccurate.

The present solution provides a global calibration approach providing a fast and robust solution to identify the parameters of the EQC models of EV lithium-ion batteries across different state of charges (SOCs) and temperatures simultaneously. The present solution can use a pre-defined parameter-dependency structure, where the values of the parameters can be expressed as smoothed functions of SOCs, and the temperature effects can be governed by the Arrhenius equation. The results can include smoothed parameter mappings that can be effectively used in the EQC models with improved model reliability.

Figure 1:
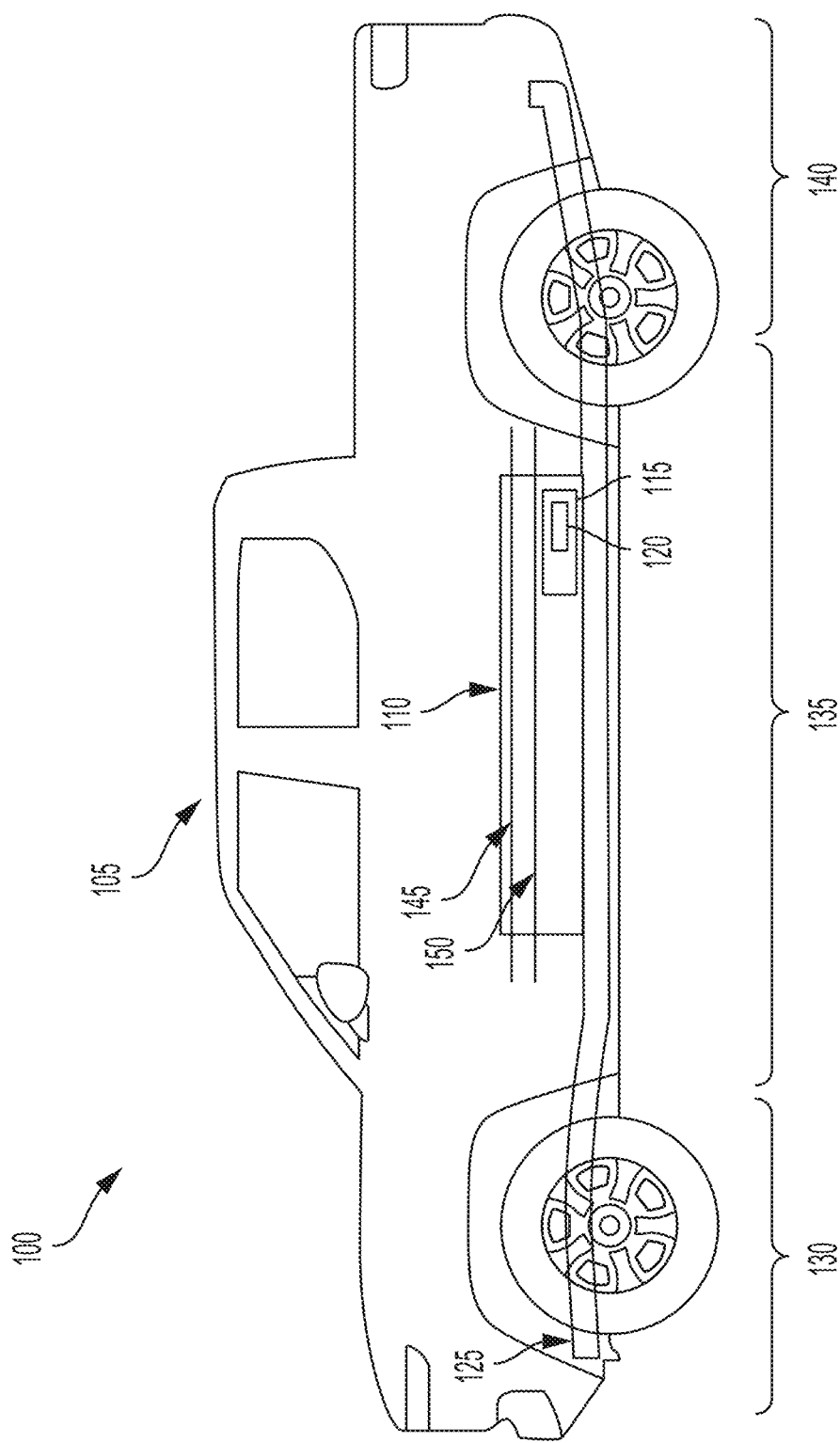
FIG. 1 depicts an example electric vehicle.

FIG. 1 depicts an example cross-sectional view 100 of an electric vehicle 105 installed with at least one battery pack 110. Electric vehicles 105, also referred to as EV 105, can include electric trucks, electric sport utility vehicles (SUVs), electric delivery vans, electric automobiles, electric cars, electric motorcycles, electric scooters, electric passenger vehicles, electric passenger or commercial trucks, hybrid vehicles, or other vehicles such as sea or air transport vehicles, planes, helicopters, submarines, boats, or drones, among other possibilities. The battery pack 110 can also be used as an energy storage system to power a building, such as a residential home or commercial building. Electric vehicles 105 can be fully electric or partially electric (e.g., plug-in hybrid) and further, electric vehicles 105 can be fully autonomous, partially autonomous, or unmanned. Electric vehicles 105 can also be human operated or non-autonomous. Electric vehicles 105 such as electric trucks or automobiles can include on-board battery packs 110, batteries 115 or battery modules 115, or battery cells 120 to power the electric vehicles. EVs 105 can include gasoline or diesel engine vehicles. The electric vehicle 105 can include a chassis 125 (e.g., a frame, internal frame, or support structure). The chassis 125 can support various components of the electric vehicle 105. The chassis 125 can span a front portion 130 (e.g., a hood or bonnet portion), a body portion 135, and a rear portion 140 (e.g., a trunk, payload, or boot portion) of the electric vehicle 105. The battery pack 110 can be installed or placed within the electric vehicle 105. For example, the battery pack 110 can be installed on the chassis 125 of the electric vehicle 105 within one or more of the front portion 130, the body portion 135, or the rear portion 140. The battery pack 110 can include or connect with at least one busbar, e.g., a current collector element. For example, the first busbar 145 and the second busbar 150 can include electrically conductive material to connect or otherwise electrically couple the battery 115, the battery modules 115, or the battery cells 120 with other electrical components of the electric vehicle 105 to provide electrical power to various systems or components of the electric vehicle 105.

Figure 2A:
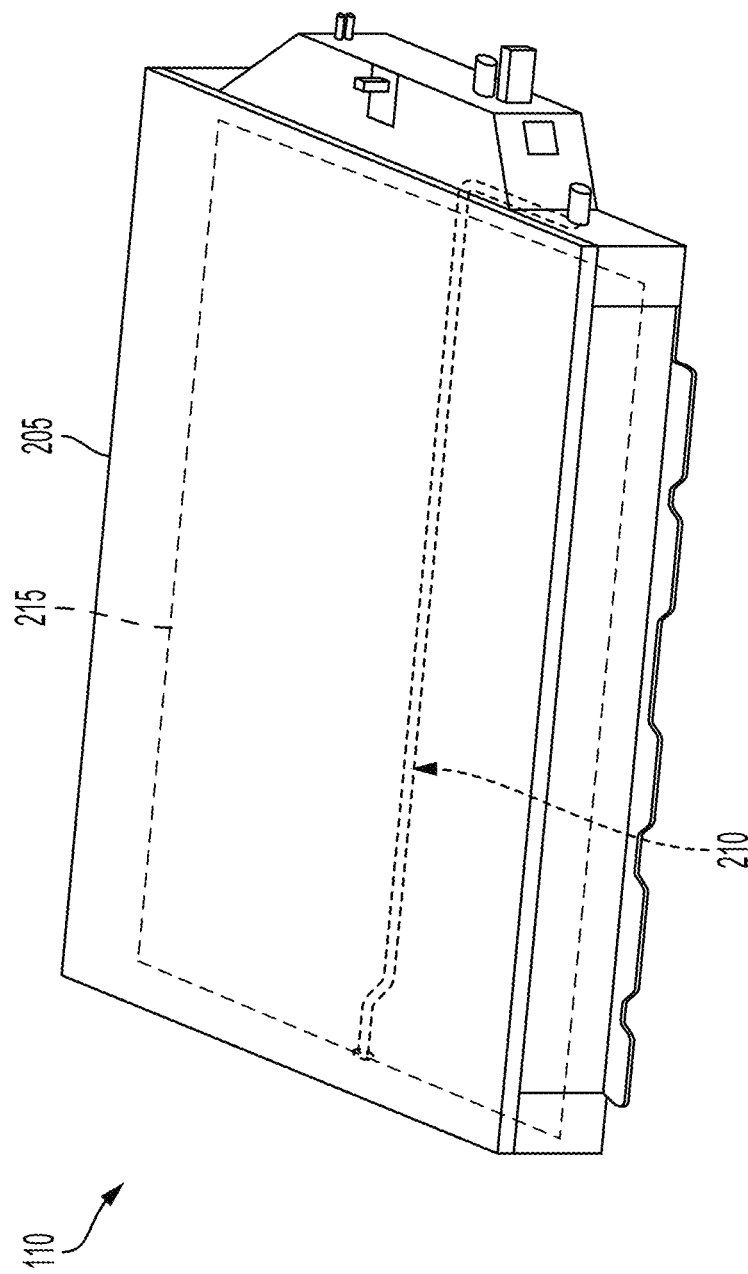
FIG. 2A depicts an example of one or more battery packs.

FIG. 2A depicts an example battery pack 110. Referring to FIG. 2A, among others, the battery pack 110 can provide power to electric vehicle 105. Battery packs 110 can include any arrangement or network of electrical, electronic, mechanical or electromechanical devices to power a vehicle of any type, such as the electric vehicle 105. The battery pack 110 can include at least one housing 205. The housing 205 can include at least one battery module 115 or at least one battery cell 120, as well as other battery pack components. The battery module 115 can be or can include one or more groups of prismatic cells, cylindrical cells, pouch cells, or other form factors of battery cells 120. The housing 205 can include a shield on the bottom or underneath the battery module 115 to protect the battery module 115 and/or cells 120 from external conditions, for example if the electric vehicle 105 is driven over rough terrains (e.g., off-road, trenches, rocks, etc.) The battery pack 110 can include at least one cooling line 210 that can distribute fluid through the battery pack 110 as part of a thermal/temperature control or heat exchange system that can also include at least one thermal component (e.g., cold plate) 215. The thermal component 215 can be positioned in relation to a top submodule and a bottom submodule, such as in between the top and bottom submodules, among other possibilities. The battery pack 110 can include any number of thermal components 215. For example, there can be one or more thermal components 215 per battery pack 110, or per battery module 115. At least one cooling line 210 can be coupled with, part of, or independent from the thermal component 215.

Figure 2B:
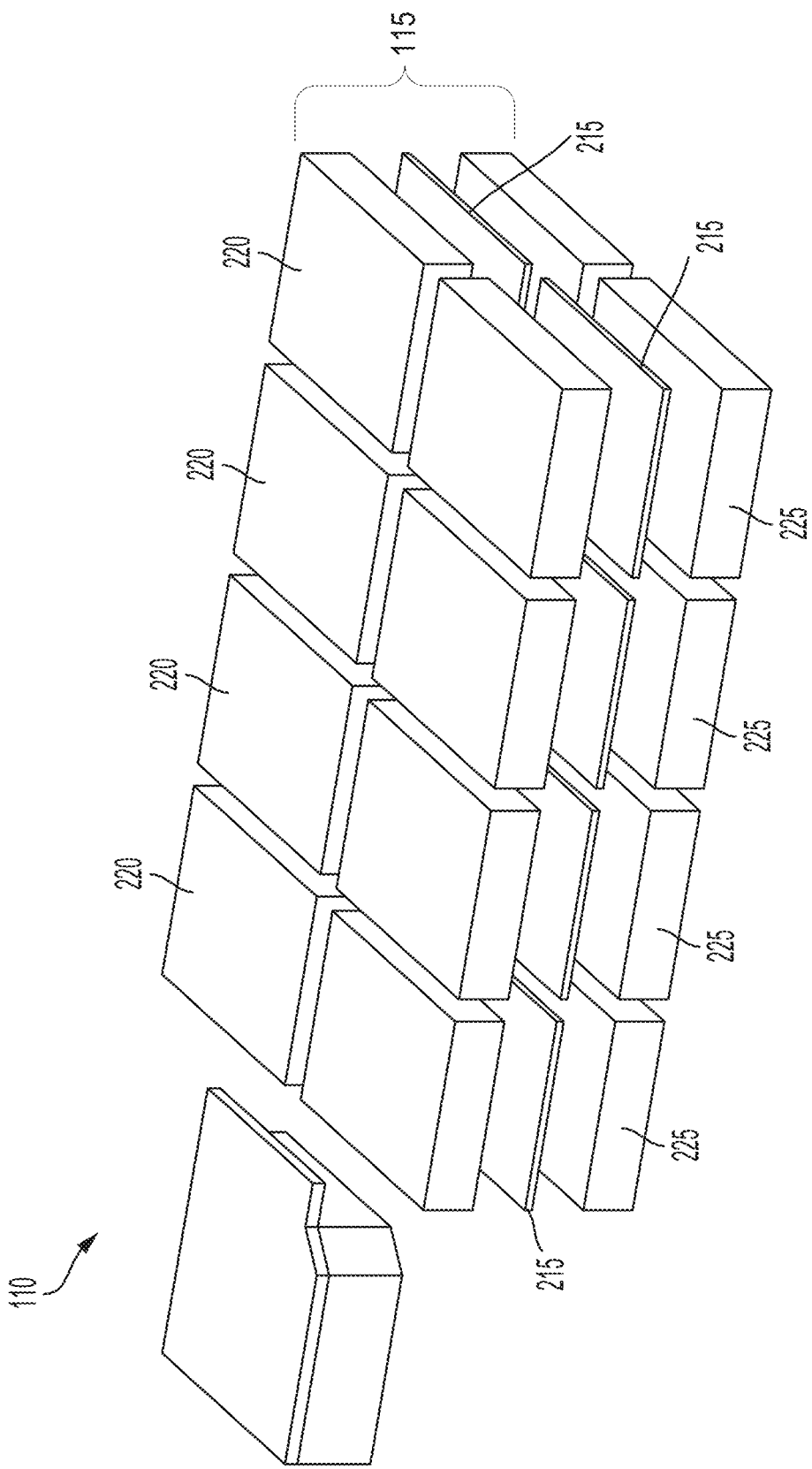
FIG. 2B depicts an example of one or more battery modules.
Figure 2C:
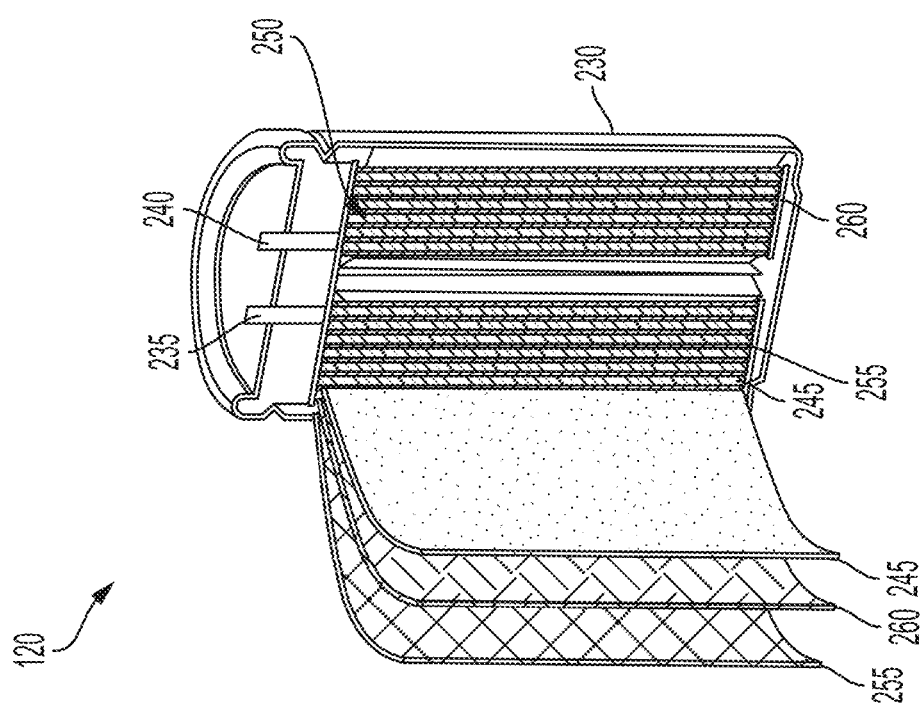
FIG. 2C depicts a cross sectional view of an example battery cell.
Figure 2D:
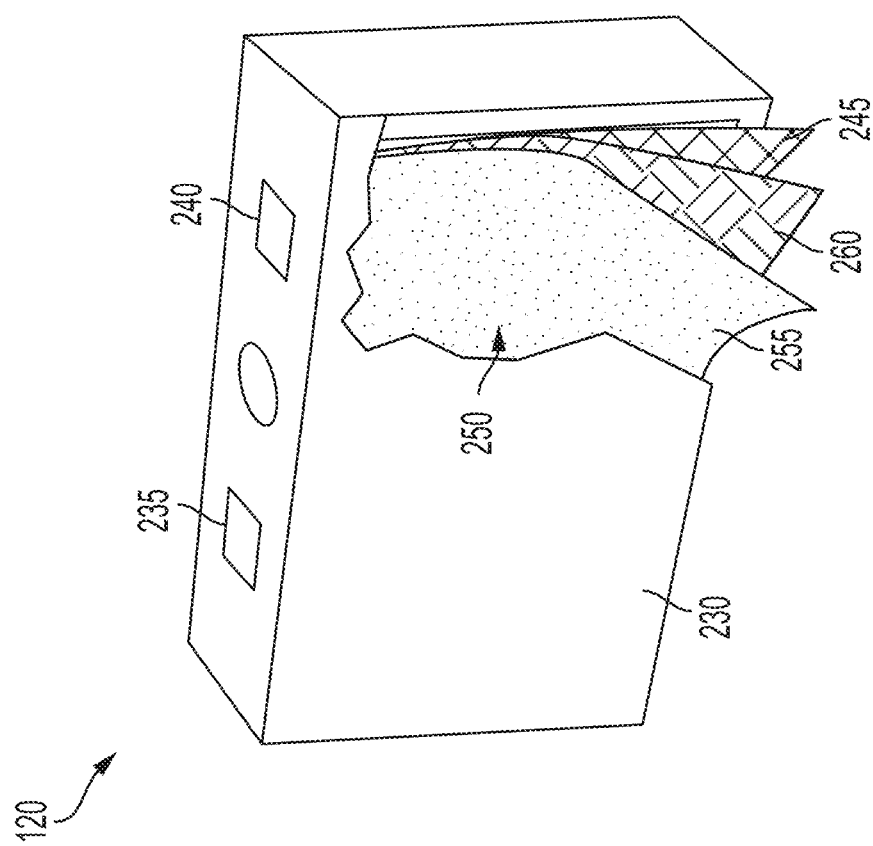
FIG. 2D depicts a cross sectional view of another example of a battery cell.
Figure 2E:
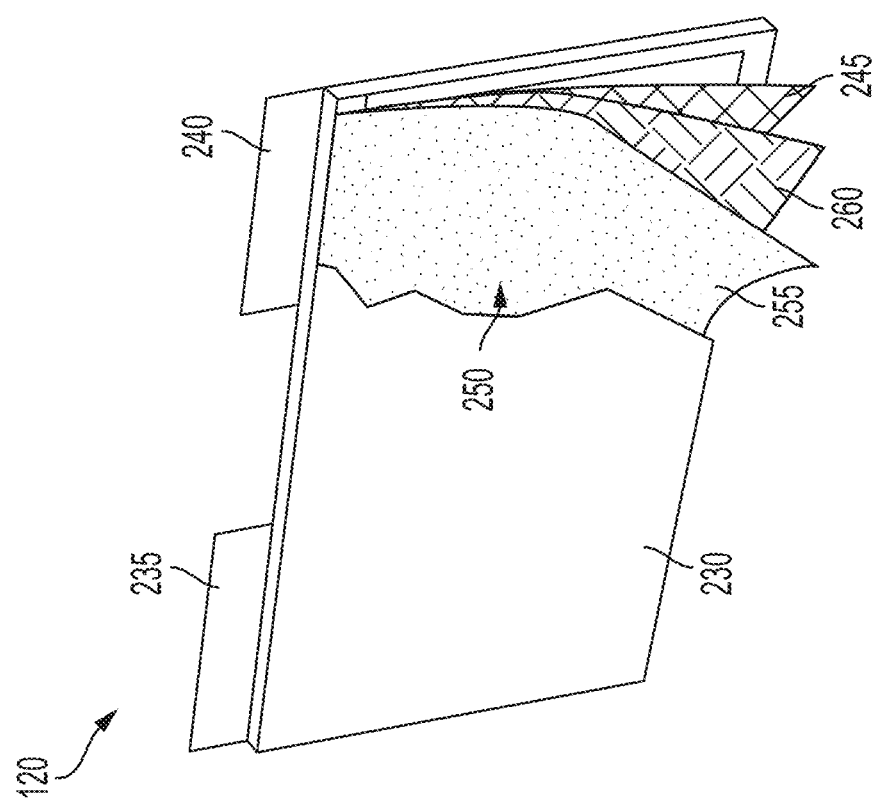
FIG. 2E depicts a cross sectional view of another example of a battery cell.

FIG. 2B depicts example battery modules 115, and FIGS. 2C, 2D and 2E depict an example cross sectional view of a battery cell 120. The battery modules 115 can include at least one submodule. For example, the battery modules 115 can include at least one first (e.g., top) submodule 220 or at least one second (e.g., bottom) submodule 225. At least one thermal component 215 can be disposed between the top submodule 220 and the bottom submodule 225. For example, one thermal component 215 can be configured for heat exchange with one battery module 115. The thermal component 215 can be disposed or thermally coupled between the top submodule 220 and the bottom submodule 225. One thermal component 215 can also be thermally coupled with more than one battery module 115 (or more than two submodules 220, 225). The battery submodules 220, 225 can collectively form one battery module 115. In some examples each submodule 220, 225 can be considered as a complete battery module 115, rather than a submodule.

The battery modules 115 can each include a plurality of battery cells 120. The battery modules 115 can be disposed within the housing 205 of the battery pack 110. The battery modules 115 can include battery cells 120 that are cylindrical cells or prismatic cells, for example. The battery module 115 can operate as a modular unit of battery cells 120. For example, a battery module 115 can collect current or electrical power from the battery cells 120 that are included in the battery module 115 and can provide the current or electrical power as output from the battery pack 110. The battery pack 110 can include any number of battery modules 115. For example, the battery pack can have one, two, three, four, five, six, seven, eight, nine, ten, eleven, twelve or other number of battery modules 115 disposed in the housing 205. It should also be noted that each battery module 115 may include a top submodule 220 and a bottom submodule 225, possibly with a thermal component 215 in between the top submodule 220 and the bottom submodule 225. The battery pack 110 can include or define a plurality of areas for positioning of the battery module 115 and/or cells 120. The battery modules 115 can be square, rectangular, circular, triangular, symmetrical, or asymmetrical. In some examples, battery modules 115 may be different shapes, such that some battery modules 115 are rectangular but other battery modules 115 are square shaped, among other possibilities. The battery module 115 can include or define a plurality of slots, holders, or containers for a plurality of battery cells 120.

Battery cells 120 have a variety of form factors, shapes, or sizes. For example, battery cells 120 can have a cylindrical, rectangular, square, cubic, flat, pouch, elongated or prismatic form factor. As depicted in FIG. 2C, for example, the battery cell 120 can be cylindrical. As depicted in FIG. 2D, for example, the battery cell 120 can be prismatic. As depicted in FIG. 2E, for example, the battery cell 120 can include a pouch form factor. Battery cells 120 can be assembled, for example, by inserting a winded or stacked electrode roll (e.g., a jelly roll) including electrolyte material into at least one battery cell housing 230. The electrolyte material, e.g., an ionically conductive fluid or other material, can support electrochemical reactions at the electrodes to generate, store, or provide electric power for the battery cell by allowing for the conduction of ions between a positive electrode and a negative electrode. The battery cell 120 can include an electrolyte layer where the electrolyte layer can be or include solid electrolyte material that can conduct ions. For example, the solid electrolyte layer can conduct ions without receiving a separate liquid electrolyte material. The electrolyte material, e.g., an ionically conductive fluid or other material, can support conduction of ions between electrodes to generate or provide electric power for the battery cell 120. The housing 230 can be of various shapes, including cylindrical or rectangular, for example. Electrical connections can be made between the electrolyte material and components of the battery cell 120. For example, electrical connections to the electrodes with at least some of the electrolyte material can be formed at two points or areas of the battery cell 120, for example to form a first polarity terminal 235 (e.g., a positive or anode terminal) and a second polarity terminal 240 (e.g., a negative or cathode terminal). The polarity terminals can be made from electrically conductive materials to carry electrical current from the battery cell 120 to an electrical load, such as a component or system of the electric vehicle 105.

For example, the battery cell 120 can include a lithium-ion battery cells. In lithium-ion battery cells, lithium ions can transfer between a positive electrode and a negative electrode during charging and discharging of the battery cell. For example, the battery cell anode can include lithium or graphite, and the battery cell cathode can include a lithium-based oxide material. The electrolyte material can be disposed in the battery cell 120 to separate the anode and cathode from each other and to facilitate transfer of lithium ions between the anode and cathode. It should be noted that battery cell 120 can also take the form of a solid state battery cell developed using solid electrodes and solid electrolytes. Solid electrodes or electrolytes can be or include organic polymeric-based electrolytes or inorganic electrolytes, for example phosphide-based or Sulfide-based solid-state electrolytes (e.g., $Li_3PS_4$, $Li_7P_3S_{11}$, $Li_2S$—$P_2S_5$, $Li_6PS_5Cl$). Yet further, some battery cells 120 can be solid state battery cells and other battery cells 120 can include liquid electrolytes for lithium-ion battery cells.

The battery cell 120 can be included in battery modules 115 or battery packs 110 to power components of the electric vehicle 105. The battery cell housing 230 can be disposed in the battery module 115, the battery pack 110, or a battery array installed in the electric vehicle 105. The housing 230 can be of any shape, such as cylindrical with a circular (e.g., as depicted in FIG. 2C, among others), elliptical, or ovular base, among others. The shape of the housing 230 can also be prismatic with a polygonal base, as shown in FIG. 2D, among others. As shown in FIG. 2E, among others, the housing 230 can include a pouch form factor. The housing 230 can include other form factors, such as a triangle, a square, a rectangle, a pentagon, and a hexagon, among others. In some embodiments, the battery pack may not include modules. For example, the battery pack can have a cell-to-pack configuration wherein battery cells are arranged directly into a battery pack without assembly into a module.

The housing 230 of the battery cell 120 can include one or more materials with various electrical conductivity or thermal conductivity, or a combination thereof. The electrically conductive and thermally conductive material for the housing 230 of the battery cell 120 can include a metallic material, such as aluminum, an aluminum alloy with copper, silicon, tin, magnesium, manganese, or zinc (e.g., aluminum 1000, 4000, or 5000 series), iron, an iron-carbon alloy (e.g., steel), silver, nickel, copper, and a copper alloy, among others. The electrically insulative and thermally conductive material for the housing 230 of the battery cell 120 can include a ceramic material (e.g., silicon nitride, silicon carbide, titanium carbide, zirconium dioxide, beryllium oxide, and among others) and a thermoplastic material (e.g., polyethylene, polypropylene, polystyrene, polyvinyl chloride, or nylon), among others. In examples where the housing 230 of the battery cell 120 is prismatic (e.g., as depicted in FIG. 2D, among others) or cylindrical (e.g., as depicted in FIG. 2C, among others), the housing 230 can include a rigid or semi-rigid material such that the housing 230 is rigid or semi-rigid (e.g., not easily deformed or manipulated into another shape or form factor). In examples where the housing 230 includes a pouch form factor (e.g., as depicted in FIG. 2E, among others), the housing 230 can include a flexible, malleable, or non-rigid material such that the housing 230 can be bent, deformed, manipulated into another form factor or shape.

The battery cell 120 can include at least one anode layer 245, which can be disposed within the cavity 250 defined by the housing 230. The anode layer 245 can include a first redox potential. The anode layer 245 can receive electrical current into the battery cell 120 and output electrons during the operation of the battery cell 120 (e.g., charging or discharging of the battery cell 120). The anode layer 245 can include an active substance. The active substance can include, for example, an activated carbon or a material infused with conductive materials (e.g., artificial or natural Graphite, or blended), lithium titanate ($Li_4Ti_5O_{12}$), or a silicon-based material (e.g., silicon metal, oxide, carbide, pre-lithiated), or other lithium alloy anodes (Li—Mg, Li—Al, Li—Ag alloy etc.) or composite anodes consisting of lithium and carbon, silicon and carbon or other compounds. The active substance can include graphitic carbon (e.g., ordered or disordered carbon with sp2 hybridization), Li metal anode, or a silicon-based carbon composite anode. In some examples, an anode material can be formed within a current collector material. For example, an electrode can include a current collector (e.g., a copper foil) with an in situ-formed anode (e.g., Li metal) on a surface of the current collector facing the separator or solid-state electrolyte. In such examples, the assembled cell does not comprise an anode active material in an uncharged state.

The battery cell 120 can include at least one cathode layer 255 (e.g., a composite cathode layer compound cathode layer, a compound cathode, a composite cathode, or a cathode). The cathode layer 255 can include a second redox potential that can be different than the first redox potential of the anode layer 245. The cathode layer 255 can be disposed within the cavity 250. The cathode layer 255 can output electrical current out from the battery cell 120 and can receive electrons during the discharging of the battery cell 120. The cathode layer 255 can also release lithium ions during the discharging of the battery cell 120. Conversely, the cathode layer 255 can receive electrical current into the battery cell 120 and can output electrons during the charging of the battery cell 120. The cathode layer 255 can receive lithium ions during the charging of the battery cell 120.

The battery cell 120 can include an electrolyte layer 260 disposed within the cavity 250. The electrolyte layer 260 can be arranged between the anode layer 245 and the cathode layer 255 to separate the anode layer 245 and the cathode layer 255. The electrolyte layer 260 can help transfer ions between the anode layer 245 and the cathode layer 255. The electrolyte layer 260 can transfer $Li^+$ cations from the anode layer 245 to the cathode layer 255 during the discharge operation of the battery cell 120. The electrolyte layer 260 can transfer lithium ions from the cathode layer 255 to the anode layer 245 during the charge operation of the battery cell 120.

The redox potential of layers (e.g., the first redox potential of the anode layer 245 or the second redox potential of the cathode layer 255) can vary based on a chemistry of the respective layer or a chemistry of the battery cell 120. For example, lithium-ion batteries can include an LFP (lithium iron phosphate) chemistry, an NMC (Nickel Manganese Cobalt) chemistry, an NCA (Nickel Cobalt Aluminum) chemistry, or an LCO (lithium cobalt oxide) chemistry for a cathode layer (e.g., the cathode layer 255). Lithium-ion batteries can include a graphite chemistry, a silicon-graphite chemistry, or a lithium metal chemistry for the anode layer (e.g., the anode layer 245). For example, a cathode layer having an LFP chemistry can have a redox potential of 3.4 V vs. $Li/Li^+$, while an anode layer having a graphite chemistry can have a 0.2 V vs. $Li/Li^+$ redox potential.

Electrode layers can include anode active material or cathode active material, commonly in addition to a conductive carbon material, a binder, other additives as a coating on a current collector (metal foil). The chemical composition of the electrode layers can affect the redox potential of the electrode layers. For example, cathode layers (e.g., the cathode layer 255) can include high-nickel content (>80% Ni) lithium transition metal oxide, such as a particulate lithium nickel manganese cobalt oxide ("LiNMC"), a lithium nickel cobalt aluminum oxide ("LiNCA"), a lithium nickel manganese cobalt aluminum oxide ("LiNMCA"), or lithium metal phosphates like lithium iron phosphate ("LFP") and Lithium iron manganese phosphate ("LMFP"). Anode layers (e.g., the anode layer 245) can include conductive carbon materials such as graphite, carbon black, carbon nanotubes, and the like. Anode layers can include Super P carbon black material, Ketjen Black, Acetylene Black, SWCNT, MWCNT, graphite, carbon nanofiber, or graphene, for example.

Electrode layers can also include chemical binding materials (e.g., binders). Binders can include polymeric materials such as polyvinylidenefluoride ("PVDF"), polyvinylpyrrolidone ("PVP"), styrene-butadiene or styrene-butadiene rubber ("SBR"), polytetrafluoroethylene ("PTFE") or carboxymethylcellulose ("CMC"). Binder materials can include agar-agar, alginate, amylose, Arabic gum, carrageenan, caseine, chitosan, cyclodextrines (carbonyl-beta), ethylene propylene diene monomer (EPDM) rubber, gelatine, gellan gum, guar gum, karaya gum, cellulose (natural), pectine, poly(3,4-ethylenedioxythiophene) polystyrene sulfonate (PEDOT-PSS), polyacrylic acid (PAA), poly(m-ethyl acrylate) (PMA), poly(vinyl alcohol) (PVA), poly (vinyl acetate) (PVAc), polyacrylonitrile (PAN), polyisoprene (PIpr), polyaniline (PANi), polyethylene (PE), polyimide (PI), polystyrene (PS), polyurethane (PU), polyvinyl butyral (PVB), polyvinyl pyrrolidone (PVP), starch, styrene butadiene rubber (SBR), tara gum, tragacanth gum, fluorine acrylate (TRD202A), xanthan gum, or mixtures of any two or more thereof.

Current collector materials (e.g., a current collector foil to which an electrode active material is laminated to form a cathode layer or an anode layer) can include a metal material. For example, current collector materials can include aluminum, copper, nickel, titanium, stainless steel, or carbonaceous materials. The current collector material can be formed as a metal foil. For example, the current collector material can be an aluminum (Al) or copper (Cu) foil. The current collector material can be a metal alloy, made of Al, Cu, Ni, Fe, Ti, or combination thereof. The current collector material can be a metal foil coated with a carbon material, such as carbon-coated aluminum foil, carbon-coated copper foil, or other carbon-coated foil material.

The electrolyte layer 260 can include or be made of a liquid electrolyte material. For example, the electrolyte layer 260 can be or include at least one layer of polymeric material (e.g., polypropylene, polyethylene, or other material) that is wetted (e.g., is saturated with, is soaked with, receives) a liquid electrolyte substance. The liquid electrolyte material can include a lithium salt dissolved in a solvent. The lithium salt for the liquid electrolyte material for the electrolyte layer 260 can include, for example, lithium tetrafluoroborate ($LiBF_4$), lithium hexafluorophosphate ($LiPF_6$), and lithium perchlorate ($LiClO_4$), among others. The solvent can include, for example, dimethyl carbonate (DMC), ethylene carbonate (EC), and diethyl carbonate (DEC), among others. The electrolyte layer 260 can include or be made of a solid electrolyte material, such as a ceramic electrolyte material, polymer electrolyte material, or a glassy electrolyte material, or among others, or any combination thereof. The ceramic electrolyte material for the electrolyte layer 260 can include, for example, lithium phosphorous oxy-nitride ($Li_xPO_yN_z$), lithium germanium phosphate sulfur ($Li_{10}GeP_2S_{12}$), Yttria-stabilized Zirconia (YSZ), NASICON ($Na_3Zr_2Si_2PO_{12}$), beta-alumina solid electrolyte (BASE), perovskite ceramics (e.g., strontium titanate ($SrTiO_3$)), among others. The polymer electrolyte material (e.g., a hybrid or pseudo-solid state electrolyte) for electrolyte layer 260 can include, for example, polyacrylonitrile (PAN), polyethylene oxide (PEO), polymethyl-methacrylate (PMMA), and polyvinylidene fluoride (PVDF), among others. Whether the electrolyte layer 260 is a separator layer that can receive a liquid electrolyte (e.g., lithium ion batteries) or an electrolyte layer that can conduct ions without receiving a liquid electrolyte (e.g., solid-state batteries), the glassy electrolyte material for the electrolyte layer 260 can include, for example, lithium sulfide-phosphor pentasulfide ($Li_2S$—$P_2S_5$), lithium sulfide-boron sulfide ($Li_2S$—$B_2S_3$), and Tin sulfide-phosphor pentasulfide ($SnS$—$P_2S_5$), among others.

In examples where the electrolyte layer 260 includes a liquid electrolyte material, the electrolyte layer 260 can include a non-aqueous polar solvent. The non-aqueous polar solvent can include a carbonate such as ethylene carbonate, propylene carbonate, diethyl carbonate, ethyl methyl carbonate, dimethyl carbonate, or a mixture of any two or more thereof. The electrolyte layer 260 can include at least one additive. The additives can be or include vinylidene carbonate, fluoroethylene carbonate, ethyl propionate, methyl propionate, methyl acetate, ethyl acetate, or a mixture of any two or more thereof. The electrolyte layer 260 can include a lithium salt material. For example, the lithium salt can be lithium perchlorate, lithium hexafluorophosphate, lithium bis(fluorosulfonyl)imide, lithium bis(trifluorosulfonyl) imide, or a mixture of any two or more thereof. The lithium salt may be present in the electrolyte layer 260 from greater than 0 M to about 1.5 M.

FIG. 3 depicts an example block diagram of an example computer system 300. The computer system or computing device 300 can include or be used to implement a data processing system or its components. The computing system 300 includes at least one bus 305 or other communication component for communicating information and at least one processor 310 or processing circuit coupled to the bus 305 for processing information. The computing system 300 can also include one or more processors 310 or processing circuits coupled to the bus for processing information. The computing system 300 also includes at least one main memory 315, such as a random access memory (RAM) or other dynamic storage device, coupled to the bus 305 for storing information, and instructions to be executed by the processor 310. The main memory 315 can be used for storing information during execution of instructions by the processor 310. The computing system 300 may further include at least one read only memory (ROM) 320 or other static storage device coupled to the bus 305 for storing static information and instructions for the processor 310. A storage device 325, such as a solid state device, magnetic disk or optical disk, can be coupled to the bus 305 to persistently store information and instructions.

The computing system 300 may be coupled via the bus 305 to a display 335, such as a liquid crystal display, or active matrix display, for displaying information to a user such as a driver of the electric vehicle 105 or other end user. An input device 330, such as a keyboard or voice interface may be coupled to the bus 305 for communicating information and commands to the processor 310. The input device 330 can include a touch screen display 335. The input device 330 can also include a cursor control, such as a mouse, a trackball, or cursor direction keys, for communicating direction information and command selections to the processor 310 and for controlling cursor movement on the display 335.

The processes, systems and methods described herein can be implemented by the computing system 300 in response to the processor 310 executing an arrangement of instructions contained in main memory 315. Such instructions can be read into main memory 315 from another computer-readable medium, such as the storage device 325. Execution of the arrangement of instructions contained in main memory 315 causes the computing system 300 to perform the illustrative processes described herein. One or more processors in a multi-processing arrangement may also be employed to execute the instructions contained in main memory 315. Hard-wired circuitry can be used in place of or in combination with software instructions together with the systems and methods described herein. Systems and methods described herein are not limited to any specific combination of hardware circuitry and software.

Although an example computing system has been described in FIG. 3, the subject matter including the operations described in this specification can be implemented in other types of digital electronic circuitry, or in computer software, firmware, or hardware, including the structures disclosed in this specification and their structural equivalents, or in combinations of one or more of them.

Figure 4:
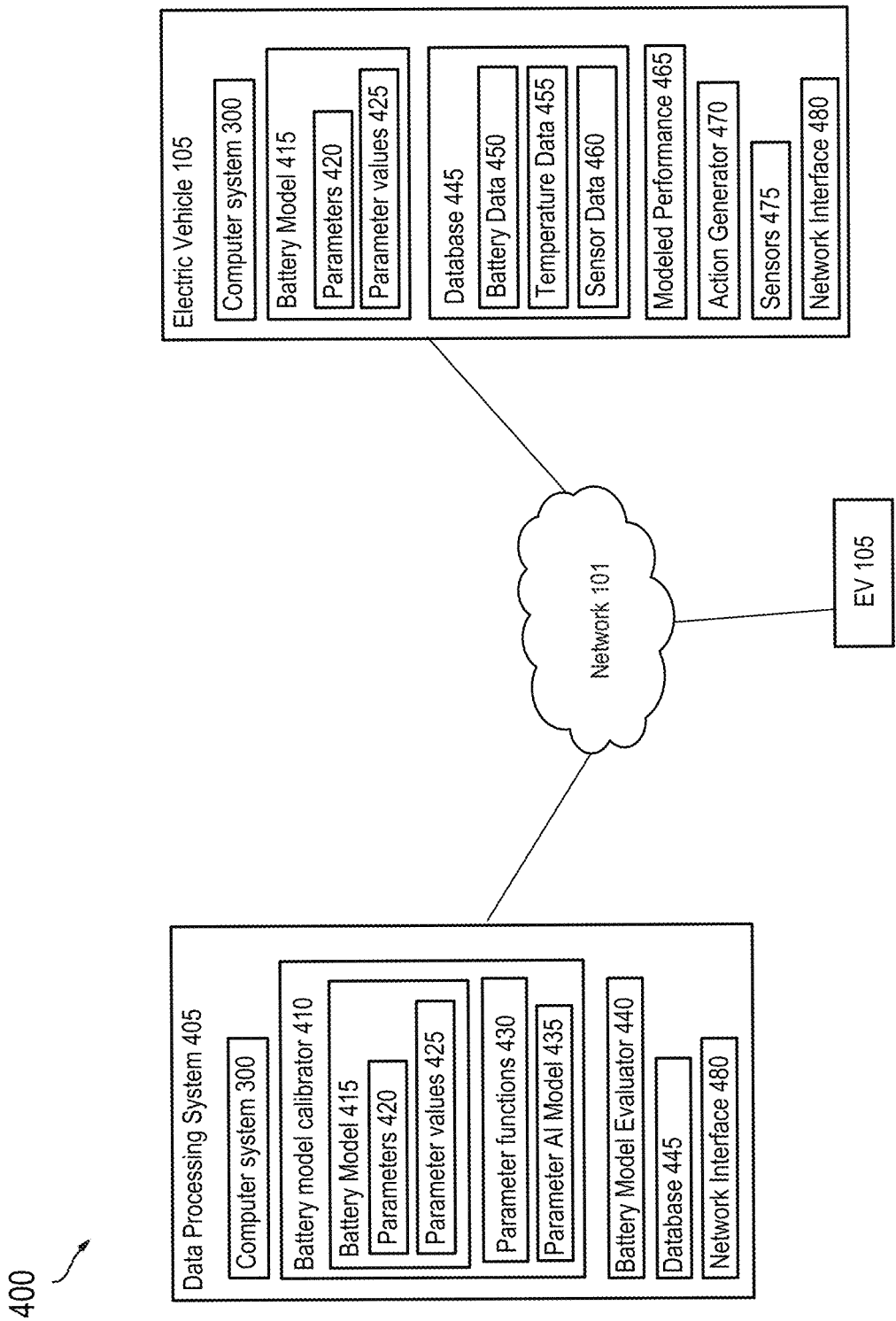
FIG. 4 is a block diagram illustrating an example of a system for implementing a global calibration of a model for a battery of an electric vehicle.

FIG. 4 depicts a block diagram of a system 400 for implementing global calibration of battery models that simulate operation of batteries in electric vehicles 105. System 400 can include a data processing system (DPS) 405 that can communicate over a network 101 with one or more electric vehicles (EVs) 105. Data processing system 405 can include one or more computer systems 300, one or more battery model calibrators 410, one or more battery model evaluators 440, one or more databases 445 and one or more network interfaces 480. The battery model calibrator 410 can include one or more battery models 415, one or more parameter functions 430 and one or more parameter artificial intelligence (AI) models 435. The battery model 415 can include or more parameters 420 and one or more parameter values 425. The EV 105 can include one or computer systems 300 and one or more battery models 415 with their parameters 420 and parameter values 425. EV 105 can include one or more databases 445, one or more battery performances 465, one or more action generators 470 or one or more sensors 475 of the electric vehicle 105. The data structure 445 can include one or more battery data 450, one or more temperature data 455 and or more sensor data 460.

The system 400 can utilize the data processing system 405, implemented on a computer system 300, to calibrate the battery model 415 using the battery model calibrator 410 by utilizing parameter functions 430, which can be based on parameter AI model 435, to generate parameter values 425 for parameters 420 of the battery model 415. Generated parameter values 425 can include one or more values or continuous, smooth and differential functions that can fit or align with the tests of the battery as a function of state of charge (SOC) and temperature of the battery. Battery model evaluator 440 can evaluate the calibrated battery model 415 for quality and accuracy of the calibration in view of the data stored in the database 445. Once calibrated, the battery model 415 can operate on a computer system 300 of an EV 105 to provide modeled performance 465 using measurements of the EV 105 from sensors 475 and based on parameters 420 and parameter values 425 that are calibrated by the battery model calibrator 410 of the DPS 405. Using the modeled performance 465 determined by the model 415, the EV 105 can generate, via action generator 470, actions for the EV 105 to implement.

DPS 405 can include any combination of hardware and software for implementing global calibration of battery model 415. DPS 405 can include a processor, a controller, a microcontroller or a control circuit and can operate, execute, or be implemented by a computer system 300. DPS 405 can include functions, computer code, scripts or instructions stored in memory, such as memory 315 or storage 325, and can be executed on one or more processors, such as processor 310. DPS 405 can include any functionality for implementing calibration of a battery model 415. DPS 405 can use data on the battery, environment of the battery or operation or state of the battery (e.g., 110, 115 or 120) to calibrate the battery model 415 or any of its components. DPS 405 can generate or determine parameters 420 or parameter values 425 for the battery model 415 using data, such as state of charge (SOC), ranges of temperatures, state of power (SOP), or state of energy (SOE). DPS 405 can execute on a central server and can communicate with EV 105 over a network 101 or on an EV 105. DPS 405 can evaluate or determine the performance of a battery model 415 and can include and utilize any data that can be stored in a database 445 to calibrate the battery model 415.

Battery model 415 can include any combination of hardware and software for representing or determining a performance or state of a battery of an EV 105, including any one or more battery packs 110, any one or more battery modules 115 or any one or more battery cells 120. Battery model 415 can include an equivalent circuit (EQC) model 415. The EQC battery model 415 can include parameters 420 that can be represented in terms of electrical circuit components, such as capacitors, resistors, inductors, diodes and more. Battery model 415 can include functions, computer code, scripts or instructions stored in memory, such as memory 315 or storage 325, and executed on one or more processors, such as processor 310 to represent, or determine a performance or a state of a battery. Battery model 415 can determine, establish, represent or predict performance, condition, present or future state or status or operation of the battery. Battery model 415 can determine, establish, represent or predict an amount of power or energy delivered from the battery, an amount of power or energy available to the battery, a battery SOC, SOP or SOE, an expected mile range remaining for the battery, expected remaining battery life, battery efficiency or any other determination that can be modeled by a battery model. Battery model 415 can include and use parameters 420 and parameter values 425 to perform calculations and determinations.

Parameters 420 can include any components or a variable of a battery model 415. A parameters 420 can include one or more inputs into the battery model 415. A parameter 420 can include a function of a battery model 415. A parameter 420 can include a function of a battery model 415. For example, parameter 420 can include or be represented by a resistor, a capacitor, an inductor or a diode in an EQC model 415. Parameter 420 can represent a component, a section or subset of a battery (e.g., battery pack 110, battery module 115 or battery cell 120) having a particular electrical resistance, capacitance, inductance or any electrical property. Parameter 420 can include resistance value (e.g., for a resistor of a model 415) or a capacitance value (e.g., for a capacitor of a model 415) representing a portion of a battery (e.g., one or more battery packs 110, battery modules 115 or battery cells 120). For example, parameter 420 can correspond to a resistance (e.g., resistor) or capacitance (e.g., capacitor) pertaining to a steady state value (e.g., unchanging capacitance or resistance). For example, parameter 420 can include a capacitance value pertaining to a variable resistance or capacitance as function of time, temperature, state or charge or any other input. Parameter 420 can include or correspond to a combination of one or more resistors and one or more capacitors that can be arranged in parallel, series or any combination of parallel and series arrangement.

Parameter values 425 can include any one or more values for a parameter 420. Parameter values 425 can include one or mere values for defining a parameter 420. Parameter values 425 can include a set value, such as a constant. Parameter values 425 can include a set of values, such as two, three, four, five, 10, 20 or more values. Parameter values 425 can include a continuous function, or a continuous line or curve of values for defining parameter 420 as a function an input variable. For example, parameter values 425 can include a continuous function for defining parameter 420 as a function of one or more of: SOC, SOP, SOE, temperature, time, or as a function of any other parameter 420.

Parameter functions 430 can include any function for determining parameters 420. Parameter functions 430 can include any functions for establishing, calculating or determining parameter values 425. Parameter functions 430 can include one or more functions, computer code, scripts or instructions stored in memory, such as memory 315 or storage 325, and can be executed on one or more processors, such as processor 310. Parameter functions 430 can include, use or perform calculations based on data or values stored in database 445. For example, parameter functions 430 can include one or more linear functions, quadratic functions, or any polynomial functions, such as a polynomial function whose highest exponent is 1, 2, 3, 4, 5, 6 or more. Parameter functions 430 can include a polynomial function for determining parameter value 425 for a parameter 420. Parameter function 430 can include a function for determining value, values, graph or a curve that correspond to a resistor or a capacitor of a battery model 415, such as an EQC battery model. Parameter function 430 can include a function for determining value, values, a graph or a curve corresponding to an RC pair of an EQC battery model that can include a resistor and a capacitor connected in a series or a parallel connection. Parameter function 430 can include a function defining or determining a single value parameter 420. Parameter function 430 can include a function defining or determining a continuous function, such as a function having a continuous line or a curve on a graph. Parameter function 430 can generate a continuous plot, a graph or a curve that fit measured test values of a battery. Parameter function 430 can generate a differentiable curve, graph or a plot that fits measured test values of a battery. Parameter function 430 can include smooth function that can generate a continuous derivative across the range of states of charges or the range of temperatures. Parameter function 430 can include or utilize a parameter AI model 435 for determining the output of the parameter function 430 (e.g., parameter value 425).

Parameter AI model 435 can include any combination of hardware and software for implementing an artificial intelligence or machine learning model for a battery (e.g., one or more battery packs 110, battery modules 115 or battery cells 120). Parameter AI model 435 can be included in a parameter function 430. Parameter AI model 435 can be used to determine output of a function 430. Parameter AI model 435 can include and utilize one or more machine learning (ML) or artificial intelligence (AI) functions. Parameter AI model 435 can include a ML functionality model trainer having any combination of hardware and software, including scripts, functions and computer code stored in memory or operating on a processor for determining parameter values 425. Parameter AI model 435 can include an ML model trainer any aspect of global calibration, including determining parameter values 425 or determining output of parameter functions 430.

Parameter AI model 435 can be or include an artificial neural network (ANN) function or a model. The ANN of the parameter AI model 435 can include a mathematical model composed of several interconnected processing neurons as units. The neurons and their connections can be trained with a data set from a database 445 to represent the relations between inputs and outputs without the knowledge of the exact information of the system model. For example, an ANN of a parameter AI model 435 can include a schematic architecture which can include a 3×2 multilayer perceptron (MLP) structure of feedforward ANN function. Parameter AI model 435 can include input vectors for the ANN function that can include the SOC, T (e.g., temperature), and I (e.g., current). Output vectors of the ANN function can include resistance values for resistor components of the battery model 415 (e.g., value, values or functions of an R0 510 resistor of an EQC model). The neurons in both hidden layer and output layer can include a sigmoid activation function. The training data for the ANN can come from the measured resistance value (e.g., measured R0 510) of a parameter 420. The measured resistance value (e.g., parameter value 425) can cover all the simulation conditions for the model. The training procedure of the ANN of parameter AI model 435 can be carried out using a Neuron by Neuron (NBN) algorithm. The ANN function of the parameter AI model 435 can generate a continuous curve and reshape the continuous curve to fit the data from the database 445. For example, ANN function of the parameter AI model 435 can fit the measured values of a parameter 420 (e.g., a set of parameter values 425) such that the continuous curve fits the measured values of the parameter 420.

Battery model evaluator 440 can include functions, computer code, scripts or instructions stored in memory, such as memory 315 or storage 325, and executed on one or more processors, such as processor 310 to evaluate the performance of a battery model 415. Battery model evaluator 440 can include the functionality for comparing the parameters 420 or parameter values 425 with the corresponding test measurements of the battery being tested. For example, battery model evaluator 440 can compare parameters 420 or parameter values 425 against outputs of the battery model 415. The outputs can correspond to, or include, any one or more of SOC, SOE, SOP or temperature which can be represented as individual values, a set of values, values determined over a period of time, or as continuous curve or curves as a function of SOC, temperature or time.

Battery model evaluator 440 can include a threshold for evaluating the calibration of the battery model 415. Battery model evaluator 440 can identify the calibration of a battery model 415 as acceptable or valid when the parameters 420 or parameter values 425 fit test (e.g., measured) values of a battery to within a predetermined threshold. The threshold can be any threshold error or variation from a measured value with which the value of the battery model 415 is being compared. For example, a threshold used by a battery model evaluator 440 can include a percentage of the parameter value 425 being determined by the battery model 415 with respect to the corresponding measured value. For example, a threshold can be set to 5% of the parameter value 425, such that when the parameter values 425 of a battery model 415 are within 5% of the measured corresponding parameter values 425, the battery model evaluator 440 can determine that the battery model 415 is successfully calibrated. The threshold value can be set at any value, such as less than 1%, up to 2%, up to 3%, up to 5%, up to 7%, up to 10% or up to more than 10% of the parameter value 425. Battery model 415 can include the threshold with respect to an output of the battery model 415. For example, battery model evaluator 440 can test the battery model 415 with the parameters 420 and parameter values 425 input into the battery model 415 and compare the output of the battery model 415 with a measured output value. Battery model evaluator 440 can determine that the model 415 is successfully calibrated if the output is within a predetermined threshold of the measured output.

Database 445 can include any organized collection of structured information or data stored in memory, such as memory 315 or 325. Database 345 can include a file system and/or tables of information for storing related to batteries of the EV 105, such as any data concerning any one or more battery packs 110, battery modules 115 or battery cells 120. Database 445 can store information, metadata, test results, values determined by battery model 415, measured values of performance of a battery of an EV 105 or any other data pertaining to EV 105. Database 445 can include battery data 450, temperature data 455 and sensor data 460. Database 445 can store any information, including any test data of a battery being modeled, including any information including or corresponding to one or more temperature measurements, SOC measurements, SOP measurements, SOE measurements or any other measurements of a battery (e.g., 110, 115 or 120). Database 445 can include information on the vehicle 105, including vehicle sensor data 460, which can include any measurements taken on or around the vehicle.

Battery data 450 can include any information or data corresponding to a battery, such as one or more battery packs 110, battery modules 115 or battery cells 120. Battery data 450 can include state of charge (SOC) of a battery, state of power (SOP) of a battery or state of energy of a battery (SOE). Battery data 450 can include temperature of a battery. Battery data 450 can include an efficiency of a battery or a remaining life of a battery. Battery data 450 can include test data, such as data from measurements taken during tests of a battery. Battery data 450 can include test data taken during hybrid pulse power characterization (HPPC) tests. Battery data 450 can include test data taken at constant current output of the battery. Battery data 450 can include information corresponding to the battery model 415. Battery data 450 can include data on parameters 420 or parameter values 420.

Temperature data 455 can include any information or data on temperature. Temperature data 455 can include data or information on the temperature of a battery, such as temperature of one or more battery packs 110, battery modules 115 or battery cells 120. Temperature data 455 can include any information or data on temperature of the ambient air, or air surrounding the battery. Temperature data 455 can include temperature measurements taken during tests. Temperature measurements can pertain to the battery or ambient air surrounding the battery.

Sensor data 460 can include any data from a sensor 475. Sensor data 460 can include measurements of any portion of EV 105. Sensor data 460 can include measurements of speed, acceleration, temperature, vibration, stress or pressure corresponding to EV 105 or battery of the EV 105. Sensor data 460 can include measurements of power, voltage, current or energy corresponding to the battery. Sensor data 460 can include measurements corresponding to determinations of SOC, SOP or SOE of the battery.

Modeled performance 465 can include any information on performance of a battery of an EV 105 or of the EV 105. Modeled performance 465 can include any determination or output from battery model 415. Battery performance can include any one or more of SOC, SOP or SOE of a battery. Battery performance can include information or data on battery efficiency, battery life or information on the remaining battery life. Modeled performance 465 can include performance of the EV 105. Modeled performance 465 can include an estimated distance remaining with the present state of charge. Modeled performance 465 can include an estimated temperature of the battery at a point in the future, such as during a scheduled trip.

Action generator 470 can include any combination of hardware and software for generating actions to be taken on EV 105. Action generator 470 can include a module for issuing notifications, alerts, commands or instructions to take action with respect to EV 105 or the battery of the EV 105. Action generator 470 can generate actions, such as an alert that a battery of the EV 105 should be charged. Action generator 470 can generate an action to control power delivered from the battery of the EV 105. For example, action generator 470 can generate a command to limit the power output from the battery to a set level. For example, action generator 470 can generate an instruction to display a value corresponding to the performance of a battery of the EV 105.

Sensor 475 can include any combination of hardware and software for taking measurements on an EV 105. Sensor 475 can include any sensor or detector or any device that produces an output signal for the purpose of sensing or detecting a physical phenomenon. Sensor 475 can include any type and form of a sensor, detector or a circuit for detecting a signal or output. Sensor 475 can include a pressure sensor, a temperature sensor, a power sensor, a voltage sensor, a current sensor, a magnetic sensor, a force sensor, a position sensor, a light sensor or a vibration sensor. Sensor 475 can include a battery sensor measuring any combination of current, voltage and temperature of a battery.

Network interface 480 can include any combination of hardware and software for communicating via a network 101. Network interface 480 can include scripts, functions and computer code stored in memory and executed or operating on one or more processors to implement any network interfacing, such as network communication via a network 101. Network 101 can include any wired or wireless network, a communication cable or a cable for transmitting information or data, a World Wide Web, a local area network, a wide area network, a Wi-Fi network, a Bluetooth network or any other communication network or platform. Network interface 480 can include functionality for communicating, via network 101, using any network communication protocol such as Transmission Control Protocol (TCP)/Internet Protocol (IP), user datagram protocol (UDP), or any other communication protocol used for communicating over a network 101. Network interface 480 can include communication ports and hardware for receiving and sending data and messages over the network 101 or via a power cable. Network interface 480 can include the functionality to encode and decode, send and receive any information, commands, instructions, data structures, values, battery model 415, parameters 420, parameter values 425 or any other information between the EV 105 and DPS 405.

Network interface 480 of DPS 405 can communicate with network interface 480 of the EV 105 to receive a non-calibrated battery model 415 from the EV 105. Then, upon calibrating the battery model 415, the network interface 480 of the DPS 405 can transmit or send the calibrated battery model 415 to the network interface 480 of the EV 105 to use on the EV 105 to model the battery (e.g., 110, 115 or 120) using the calibrated battery model 415.

For example, a system 400 can include one or more processors of an EV 105, such as a processor 310. The one or more processors can be coupled to memory, such as memory 315 or 325. The one or more processors can include instructions that can be stored in the memory and processed on the one or more processors to implement functionality of the system 400. For example, the one or more processors can identify, for the electric vehicle 105, a battery model 415. The battery model 415 can be programmed or configured to determine performance of a battery (e.g., battery pack 110, battery module 115 or battery cell 120) of the electric vehicle 105 based on a parameter function 430. The parameter function 430 can generate parameter values 425 for a parameter 420 of the battery model 415 across a range of states of charges (SOCs) and a range of temperatures. The one or more processors can generate, based on input from a sensor 475 of the electric vehicle 105, a value of performance (e.g., modeled performance 465) of the electric vehicle 105 via the battery model 415. The one or more processors can provide an action by an action generator 470 for the electric vehicle 105 based on the value of the modeled performance 465.

The one or more processors can generate the value of performance (e.g., modeled performance 465) comprising at least one of a state of charge of the battery (e.g., 110, 115 or 120) of the electric vehicle 105, a state of power of the battery (e.g., 110, 115 or 120), or a state of energy. The one more processors can provide the action by the action generator 470 comprising a graphical user element that displays the value of the performance (e.g., modeled performance 465) via a display device of the electric vehicle 105. The graphical user element can include one or more of: a graph, a message, an image, a map, an indication of or location of charging stations in the vicinity of the vehicle or an alert or indication of a particular state of battery (e.g., a particular SOC, SOP or SOE being reached). The one or more processors can generate the action by the action generator 470 comprising an instruction to charge the electric vehicle 105. The one or more processors can generate the action to control power delivered from the battery (e.g., 110, 115 or 120) of the electric vehicle 105.

The one or more processors can receive the battery model 415 from a data processing system 405 remote from the electric vehicle 105. The data processing system 405 can calibrate the battery model 415 based on the parameter function 430 that generates the parameter values 425 for the parameter 420 of the battery model 415 across the range of states of charges and the range of temperatures. The battery model 415 can include an equivalent circuit model (EQC). The parameter 420 can include a resistance or a series of resistance and capacitance.

In some aspects, the present disclosure relates to a non-transitory computer-readable medium that can include instructions. When executed by one or more processors, such as processor 310, the instructions can cause the one or more processors to identify a parameter 420 of a battery model 415 used to determine a performance (modeled performance 465) of a battery (e.g., 110, 115 or 120) via the battery model 415. The instructions can cause the one or more processors, such as processor 310, to calibrate the battery model 415 based on a parameter function 430 that generates parameter values 425 for the parameter 420 of the battery model 415 across a range of states of charges and a range of temperatures. The instructions can cause the processor, such as processor 310, to identify values of the parameter of the model 415 across a range of states of charges and a range of temperatures .The instructions can cause the one or more processors, such as processor 310, to provide the battery model 415 calibrated by the battery model calibrator 410 for the battery model 415 to cause the battery model 415 to determine the modeled performance 465 responsive to input. The parameter function 430 can include a smooth function that can include a continuous derivative across, or corresponding to, the range of states of charges and the range of temperatures.

Figure 5:
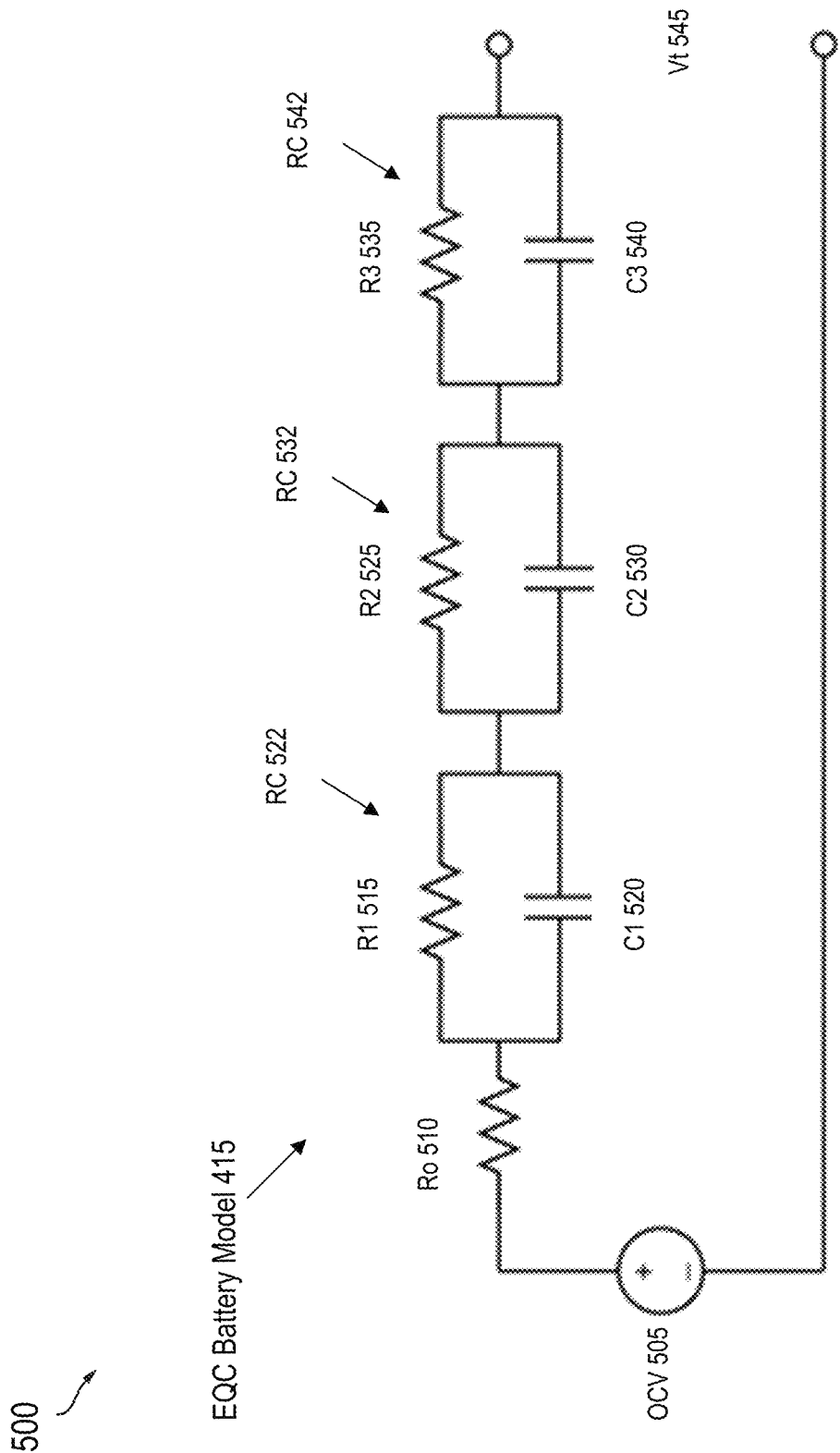
FIG. 5 depicts an example diagram of a battery model implemented as an equivalent circuit (EQC) model of a battery of an electric vehicle.

FIG. 5 depicts a diagram 500 of an example battery model 415 that is implemented as an equivalent circuit (EQC) battery model 415. EQC battery model 415 can be one of multiple ways battery model 415 can be implanted. EQC battery model 415 can be used to simulate modeled performance 465 of a battery pack 110. For example, an EQC model 415 can be used to simulate performance of a state of charge (SOC), a state of power (SOP) or a state of energy (SOE) of a battery (e.g., battery pack 110, battery module 115 or battery cell 120) of an EV 105.

EQC battery model 415 can include a structure represented as an electrical circuit that can correspond to a battery (e.g., 110, 115 or 120). EQC battery model 415 can include a number of parameters 420 that can correspond to components of the EQC battery model 415 in terms of their contribution to the resistance or capacitance to the battery being simulated. Parameter 420 can include components providing resistance, such as electrical resistors R0 510, R1 515, R2 525 or R3 535. Parameters 420 can include components providing capacitance, such as electrical capacitors C1 520, C2 530 or C3 540. Parameters 420 can also refer to a RC pair components that are made up of a pair of resistor and a capacitor arranged in a parallel connected with each other, such as RC pairs 522, 532 and 542. RC 522 can be made up of resistor R1 515 and capacitor C1 520, RC 532 can be made up of resistor R2 525 and capacitor C2 530 and RC 542 can be made up of resistor R3 535 and capacitor C3 540. The series of resistance and capacitance can be functions of battery data 450 corresponding to test measurements or data on SOC and temperature of the battery being simulated.

EQC battery model 415 can include an open circuit voltage (OCV) 505, which can correspond to the voltage between a battery's positive and negative terminal when no current flows to or from the battery and electrode potentials are at the equilibrium state. The positive terminal of the OCV 505 can be in electrical contact with R0 510, which can correspond to the ohmic resistance and charge transfer resistance of the battery. Connected in series with the R0 510, can be one or more pairs of parallel resistors and capacitors (RC pairs 522, 532 and 542). EQC battery model 415 can have a Vt 545, corresponding to the terminal voltage of the battery, at the node that is behind the last of the RC pairs and the negative terminal of the OCV 505. In the EQC battery model 415, Vt 545 can be expressed as: $V_t(545) = OCV(505) - IR_0(510) - I\Sigma_{i=1}^{3} R_i(1-e^{-t/R_iC_i})$, where variable "I" represents the current and Ri and Ci represent the resistors (e.g., 515, 525 and 535) and capacitors (e.g., 520, 530 and 540) in the series of RC pairs following R0 510.

The present disclosure provides a solution that can identify the parameters 420 (and their parameter values 425) of the EQC battery model 415 across a range of different state of charges (SOCs) and temperatures of a battery being simulated, at the same time. The present solution can use a pre-defined parameter-dependency space/structure, in which the values of the parameters 420 (e.g., parameter values 425) can be expressed in terms of smoothed, continuous differentiable functions (of SOCs, and temperatures. The identified parameters 420 can be expressed as smoothed, differentiable mappings, functions, curves or graphs that can be plotted across (e.g., as a function of) the entire range of application conditions, and can be effectively used in the EQC battery models 415 for simulations or determinations of battery's modeled performance 465.

EQC battery model 415 can correspond to any battery model 415 and steps or actions applied to the EQC battery model 415 example can be applied on any type of battery model 415. EQC battery model 415 can included or be modeled based on a resistance and capacitance (RC) equivalent circuit model that corresponds to various features of the battery of an EV 105.

EQC battery model 415 can relate to a decomposition of terminal voltage, Vt 545 which can be simulated at a constant discharge current I. EQC battery model 415 can also related to, correspond to, or indicate an overpotential of the battery. The overpotential of a battery can be the potential difference (e.g., voltage measure) between a theoretical (e.g., thermodynamically determined) voltage of the battery and the actual voltage of the battery under operating conditions. The total overpotential of the battery can be the difference between the terminal voltage Vt 545 and the OCV 505. The total overpotential of the battery can be decomposed into individual overpotentials caused by R0 510 and the RC pairs (e.g., R1 515 and C1 520, R2 525 and C2 530 and R3 535 and C2 540).

The overpotential caused by R0 510 can be a fixed value that can be proportional to the applied current. The overpotential due to different RC pairs (e.g., R1 515 and C1 520 or R2 525 and C2 530 or R3 535 and C3 540) can vary at different time intervals as they may be governed by values of each parameters 540 and their different time constants. For example, overpotentials by R0 and different RC pairs can increase and decrease with respect to each other, as a function of time. For example, in the first 2 seconds after discharge, the voltage drop caused by R0 and RC1 can dominate the overall overpotential. However, after about 7 seconds, the voltage drop by RC2 can increase to become a significant factor at about the same or greater contribution as R0 or RC1. The voltage drop caused by RC3 can gradually increase over discharge time and at about 30 minutes can become dominant (e.g., greater of all individual overpotential contributors from R0 and RC pairs). In some implementations, in order to accurately capture the characteristics of each parameter 420 in the EQC battery model 415, experimental data at different time scales can be used so as to account for all overpotential contributors at different time intervals.

In order to find out the sensitivity of parameters 420 on the Vt 545 terminal voltage (e.g., the impact a parameter has on the terminal voltage), the sensitivity variables (Si) can be calculated. Sensitivity variables can be expressed using normalized partial derivative of the Vt 545 function utilizing parameters 420. The sensitivity variables of each parameter at different time scales can be used to show the sensitivity of each parameter 420 varying at different time steps. In one example, R0 510 can be the most sensitive parameter in the first short interval after the discharge, such as in the initial 17 seconds after the discharge. The sensitivity of R1 515 can increase at first 1 second, and can be a constant with the value of 0.05, while the sensitivity of C1 520 can reach a peak at around 0.5 second and then decrease to become generally negligible. The sensitivity of R2 525 can increase at discharge and becomes the most sensitive parameter after a longer time interval (e.g., about 350 seconds), while the sensitivity of C2 can increase at the beginning of discharge, then reach a peak at about 10 seconds, and then decrease. The sensitivity of R3 535 and C3 540 can be negligible in the first 30 s of discharge, but then they can increase as the cell is discharged to 0.5 s. C3 540 can become the second significant parameter after about 900 seconds.

The results of the parameter sensitivity analysis can show that each parameter 540 in the EQC battery model 415 can have different impact on the terminal voltage Vt 545, and thus becomes identifiable or more pronounced at different time scale in terms of the overall overpotential. Therefore, the experimental data at different time scales can be used to calibrate the parameters 540. For example, experimental data with different time duration of current excitation can be used to perform the global calibration. For example, hybrid pulse power characterization (HPPC) profiles can be mainly used for the calibration of the significant/sensitive parameters 420 at short time duration while the constant current (CC) profiles can be used for those with at large time scales.

Global calibration can refer to the way the parameters are formulated and identified. Based on the physical principles and observations of the experimental analysis, the parameters within the EQC battery model 415 can vary in different conditions. For example, the term R0 can vary at different variable of SOC, temperature and current, while the RC pairs can be functions of SOC and temperature. These functions can be presented by smoothed mappings across the accessible ranges of each variable. In order to identify these parameters, a series of experiments can be conducted at discrete testing conditions. For the calibration of R0, the values at each testing conditions can be first determined by the direct current internal resistance (DCIR), and then the global calibration can be used to generate a smoothed function. For the calibration of RC pairs, the global calibration can first create a framework—a set of semi-empirical equations that describe the dependence of SOC and temperature. In the semi-empirical equations, the parameters of the equations can be expressed as a matrix. By feeding into the testing data, an optimization processing algorithm can work to find the optimal parameter matrix that best fit the simulation results to the measured ones. The global calibration methodology can allow the simultaneous identification of EQC model parameter with the whole operation conditions, and results in smoothed parameter mappings.

The global calibration can include several advantages. For example, it can allow the calibration across different conditions at the same time, which can provide a practical and time efficient solution. The semi-empirical equations can ensure a smoothed parameter set, which can minimize the error and increase the fidelity and robustness of the model. The allocated structure/space of the parameters can inherently include the temperature effects, which can extend the temperature tolerance of the test data. The present solution can operate using a limited experimental data set, which can save experimental time and resources.

Figure 6:
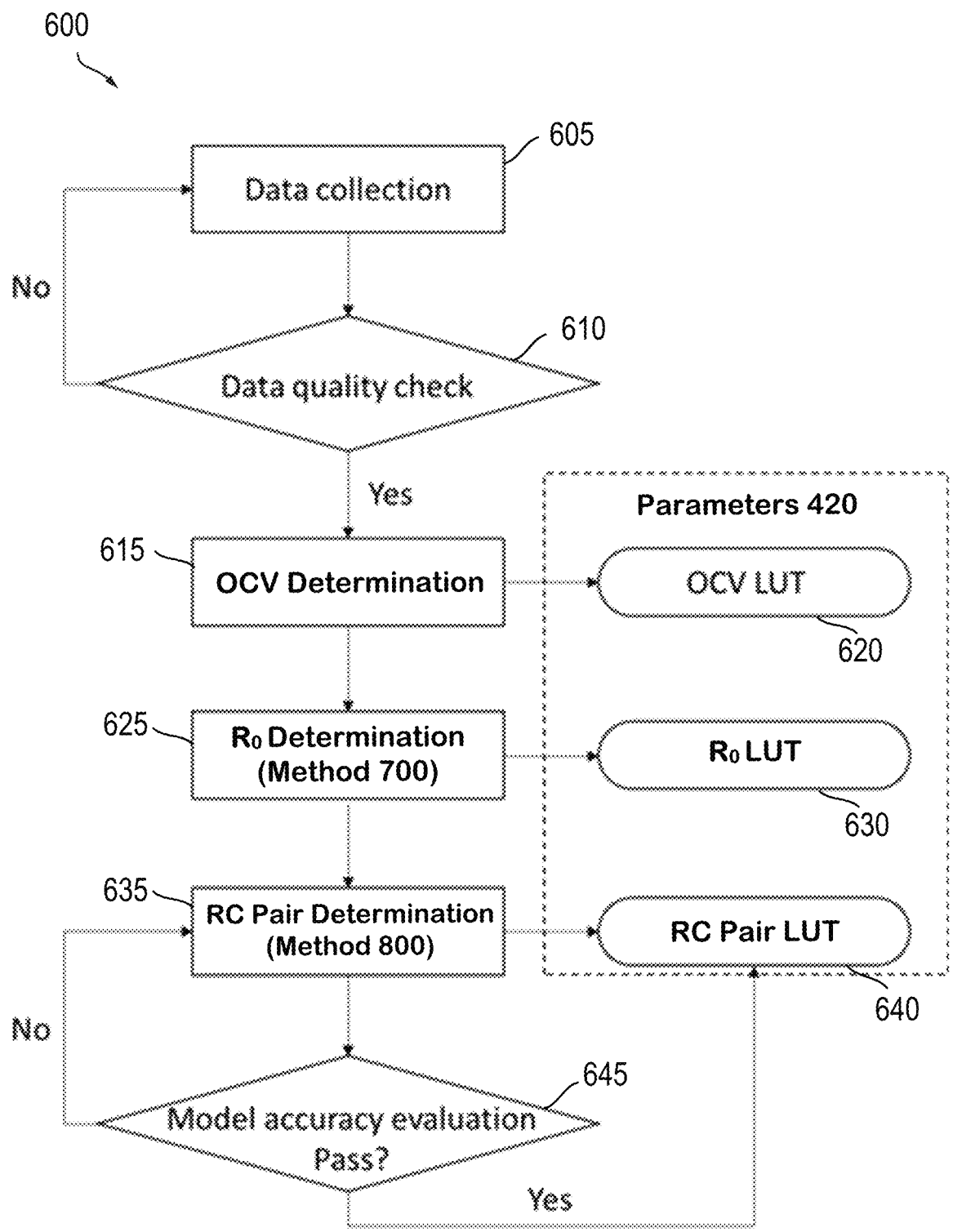
FIG. 6 is a flow diagram of an example method of implementing a global calibration of a battery model, such as an EQC battery model, of a battery of an electric vehicle.

FIG. 6 illustrates an example flowchart of a method 600 of implementing global calibration. The method 600 can be performed, for example, by one or more component of system 400 depicted in FIG. 4, including, for example, the data processing system. Method 600 can include ACTS 605-645. At ACT 605, the method 600 can include the data processing system performing data collection for the calibration. At ACT 610, the method 600 can include the data processing system performing a data quality check to identify quality data for the calibration. At ACT 615, the method 600 can include the data processing system performing an OCV determination. At ACT 620, the method 600 can include the data processing system outputting the result of the OCV determination into the OCV look up table (LUT) of an EQC model parameter set. At ACT 625, the method 600 can include the data processing system performing an R0 determination using method 700. At ACT 630, the method 600 can include the data processing system outputting the resulting Ro determination into a R0 LUT of the EQC model parameter set. At ACT 635, the method 600 can include the data processing system performing RC pair determination using method 800. At ACT 640, the method 600 can include the data processing system outputting RC pair determination into the RC Pair LUT. At ACT 645, the method 600 can include the data processing system determining or evaluating the accuracy of the model.

At ACT 605, the method performs data collection for the calibration. Data collection can include gathering experimentally measured data. Data can include measurements of time such as time stamps, which can be associated with "I" which denotes current, Vt 545 terminal voltage, and "T" that denotes temperature of the battery. Data measurements can be taken at designated conditions in accordance with testing protocols, such as at set ambient temperature levels or set SOC level.

At ACT 610, the method performs data quality check. The method can check if the data meets the requirements for the calibration process. For example, the method can check if the data meets a target current profile. The method can check if the data meets current and temperature tolerances. The method can check if the data meets or conforms to the correct sampling time. The method can check if duplicate and bad data exists and can detect them and remove them from the data set.

In order to organize the data set, such as the data set of a battery in a database 445 on either DPS 405 or EV 105, as well as increase the computational efficiency, a data class (EQCDataClass) can be created to store the measured data and pre-allocate spaces for the identified parameters. The structure of the EQCDataClass can include basic information, which can include model information (e.g., model type), test information (e.g., test type) and any file names of the files used. The structure can include one or more data sets, such as raw data, data on time, data on voltage, data on current, data on capacity or capacitance, and data on temperature. The structure can include calculations and their results, such as those pertaining to SOC, OCV 505, entropy coefficients and parameters 420 pertaining to various resistance and capacitance. The data structure can include information on simulations, such as simulation data relating to time and voltage and simulation data error.

At ACT 615, calculation of OCV 505 is performed. As OCV 505 can represent the voltage between the battery's positive and negative terminals when no load is applied, it can be expressed as a function of SOC, temperature, and charge/discharge direction. To obtain the OCV table (e.g., LUT of OCV 505) of a battery (e.g., pack 110, module 115 or a cell 120), it can be first experimentally measured at room temperature (T0), and calculated across different temperatures by the entropy coefficient. The entropy coefficient can correspond to the change in OCV over time, e.g., $(d(OCV)/d(T))$.

For example, OCV 505 can be expressed as:

$$OCV(T) = OCV(T_0) + \frac{dOCV}{dT} \times (T - T_0)$$

At room temperature, OCV 505 can be directly measured by galvanostatic intermittent titration technique (GITT) or low-current charge/discharge method. The entropy coefficient can be measured by potentiometric method or calorimetric method.

At ACT 620, results of the OCV 505 calculations completed at ACT 615 can be entered into a look up table (LUT) for the OCV 505. The OCV LUT can be a part of the set of parameters 420 of the EQC battery model 415.

At ACT 625, R0 calculation can be performed. As R0 510 can correspond to ohmic resistance and charge transfer resistance, it can be reflected as an immediate voltage drop at the excitation of the current pulse. R0 510 can be determined using method 700, which is described in further detail in FIG. 7 below.

At ACT 630, results of the R0 510 calculations completed in ACT 620 can be entered into a look up table (LUT) for the R0 510. The R0 LUT can be a part of the EQC battery model 415 parameter set.

At ACT 635, RC Pair calculations can be performed. As RC Pairs can have parallel connected resistors and capacitors, they can represent the transient dynamics with different time constants. They can be determined by a curve fitting (optimization) process to best fit the simulated Vt 545 terminal voltage curve to the experimentally measured Vt 545 curve. The values of resistors and capacitors in the RC pairs can vary as a function of SOC, and temperate (T). RC Pair calculations can be performed using method 800, described in further detail in connection with FIG. 8 below.

At ACT 640, results from RC Pair calculations completed at ACT 630 can be entered into a LUT for R and C values of the corresponding RC pair. For example, for the first RC pair, results can be entered into the LUT for R1 515 and C1 520, while for the second RC pair, the result can be entered into LUT for R2 525 and C2 530.

At ACT 645, model accuracy evaluation can be performed to determine if the current version of the EQC battery model 415 meets the accuracy threshold. For example, the whole set of parameters 420 of the EQC model 415 (e.g., OCV LUT, R0 LUT and RC Pair LUT) can be fed into the current version of the battery model evaluator 440 to confirm if the battery model 415 satisfies the accuracy and conforms to the test data within a predetermined threshold. In some instances, the optimization function for the RC pairs in ACT 820 of the method 800 can include multiple local minimums, depending upon the properties of the battery (e.g., 120, 115 or 110), the data set volume and the selected optimization function. After the RC pairs (e.g., Rx and Cx) are determined at ACT 635, the set of parameters 420 can be fed into the model and the accuracy of the model can be evaluated.

Then, if the model with the calibrated Rx and Cx values meet the accuracy requirements, then the method 600 is completed and the current version of the battery model 415 is the model to be sent to the EV 105 to be used by the EV 105 for modeling of the battery 110, 115 or 120 on the EV 105. If however, the accuracy model does not meet the accuracy criteria, then the method 600 goes back to ACT 635 to repeat the process and either modify RC pair calculations or add additional RC pairs (e.g., R and C parallel circuits to the EQC battery model 415) to modify the output and continue adjustments until the accuracy is satisfied.

Figure 7:
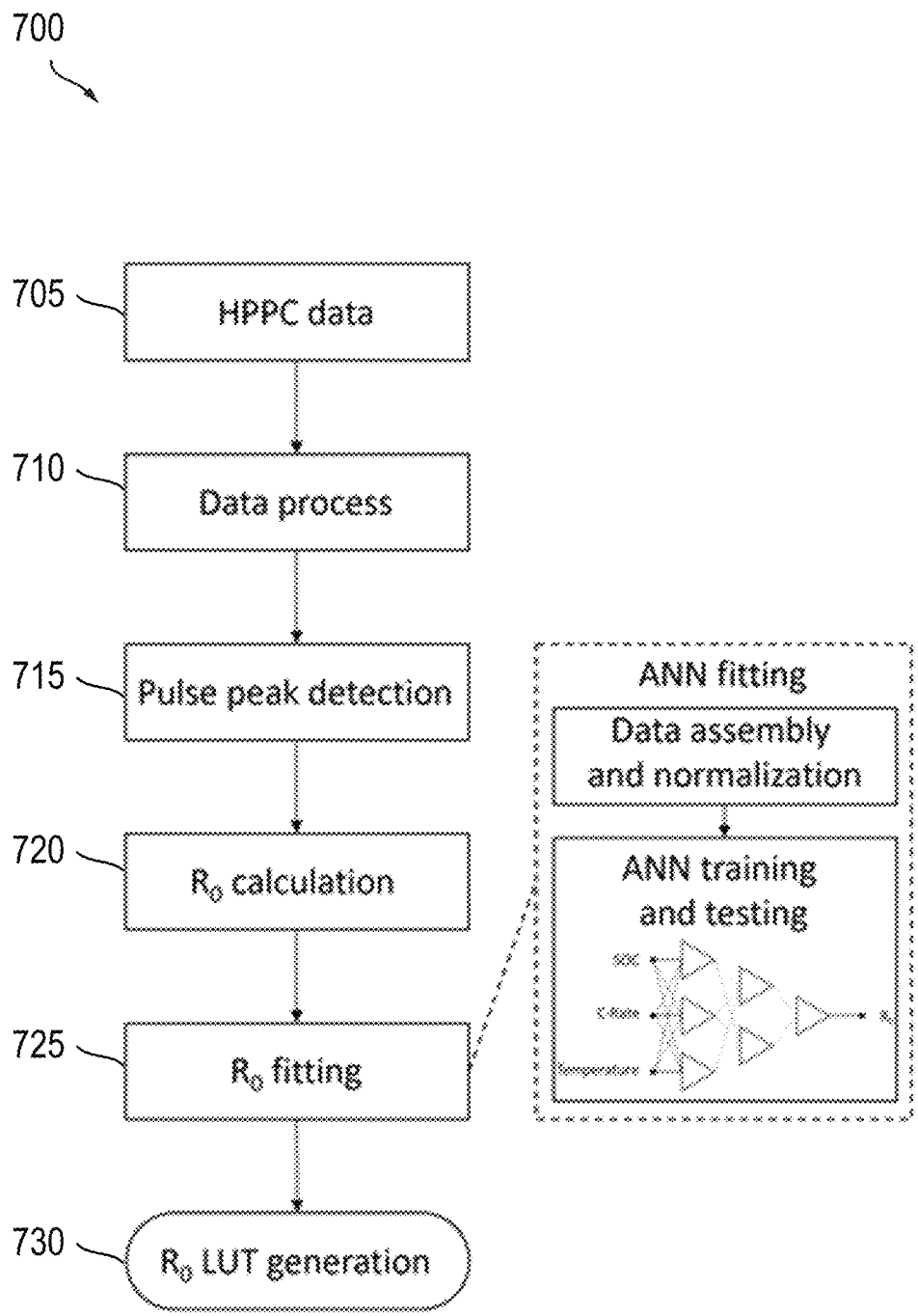
FIG. 7 is a flow diagram of an example method for determining the value of a $R_0$ resistance parameter of the model, such as an EQC battery model, of a battery of an electric vehicle.

FIG. 7 illustrates an example flowchart of a method 700 of determining R0 calibration. Method 700 can include ACTS 705-730. The method 700 can be performed, for example, by one or more component of system 400 depicted in FIG. 4, including, for example, the data processing system. At ACT 705, hybrid pulse power characterization (HPPC) data is obtained by a HPPC test. At ACT 710, data is processed. At ACT 715, pulse peak detection is performed. At ACT 720, R0 can be determined. At ACT 725, R0 fitting is performed (e.g., using an AI model). At ACT 730, R0 LUT is generated.

At ACT 705, HPPC data can be obtained. The data used for the R0 calibration can be acquired or obtained by a HPPC test. HPPC test can include a series of discharge pulses that take place at various states of charge (SOC) and under various temperature and current loads. The data HPPC data collected can include any combination of time data (e.g., time stamps) or data on current, voltage and temperature.

At ACT 710, data is processed. For example, data can be rearranged, filtered and preprocessed. Data can be quality control checked similar to ACT 610 in method 600.

At ACT 715, pulse peak detection can be performed. The pulses included in the data can be detected and recorded. Pulses can be determined based on any combination of time, voltage or current measurements.

At ACT 720, the value of R0 at each pulsed signal can be determined or calculated. R0 can be calculated or determined based on direct current internal resistance (DCIR) at $t=t_0+\Delta t$. For instance, R0 data can be determined by reading the data values at $t=t_0+\Delta t$. For example, R0 can be determined based on a voltage drop and the corresponding current pulse that occurs immediately at the current pulse, or immediately following the current pulse. The R0 can be calculated based on the formula:

$$R_0 = \frac{V_t(t_0 + \Delta t) - V_t(t_0)}{I(t_0 + \Delta t) - I(t_0)}$$

At ACT 725, the calculated R0 can include a series of discrete data points that can be converted into a smoothed function to be used in the EQC battery model 415 at different conditions. To globally fit the R0 expression, a function with three inputs and one output can be implemented, as expressed in: $R_0 = f(SOC, T, I)$, where R0 is a function of SOC, T which denotes temperature and I that denotes current. R0 can be a nonlinear function. To resolve the function and find an applicable analytical expression that combines these factors, a data-driven approach, can be used, such as an artificial neural network (ANN), which can be implemented as a part of parameter AI model 435.

At ACT 730, R0 output can be generated and provided to the R0 LUT at ACT 630 of the method 600.

Figure 8:
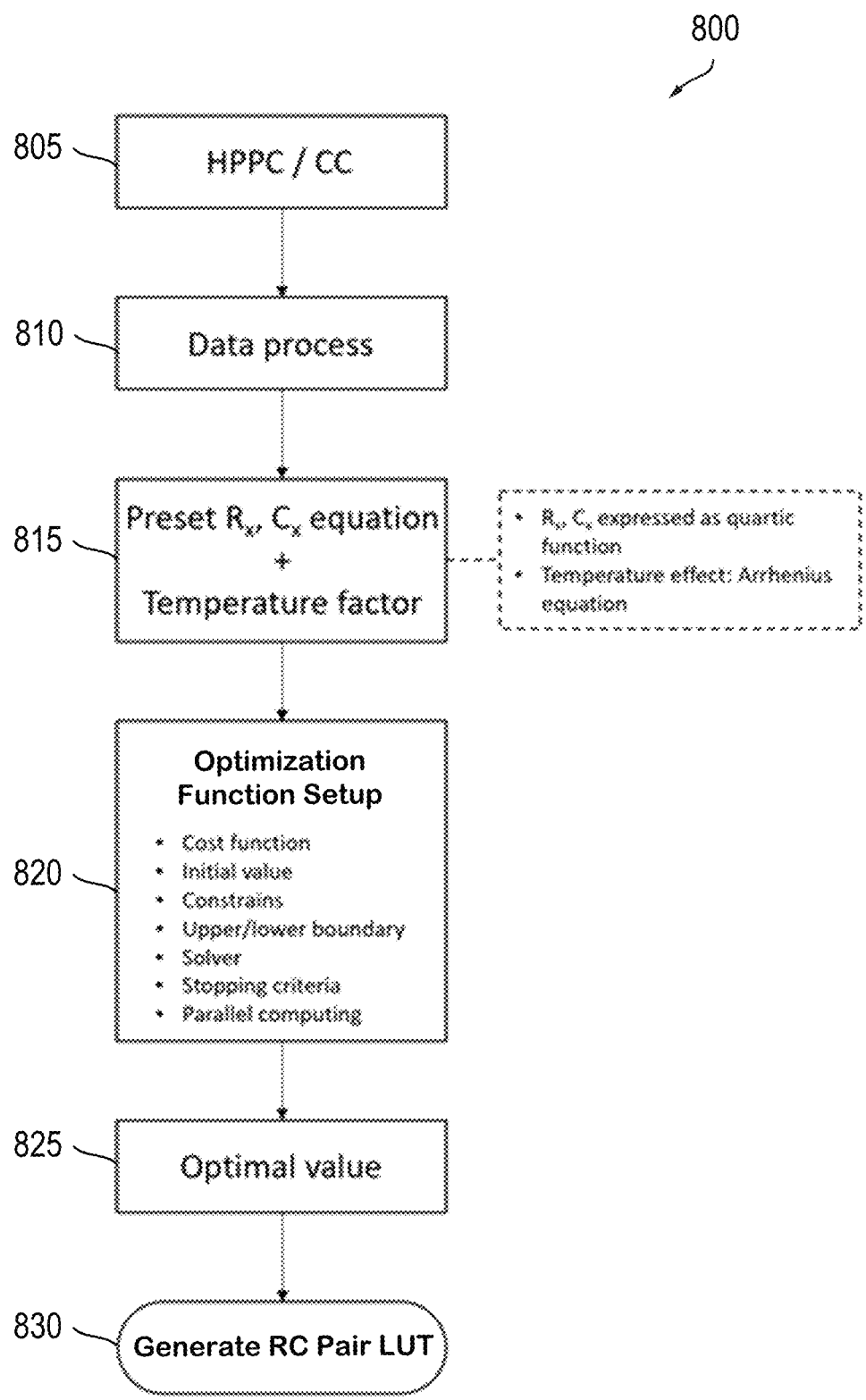
FIG. 8 is a flow diagram of an example method for determining the value of a RC pair capacitive and resistive parameter of the model, such as an EQC model, of a battery of an electric vehicle.

FIG. 8 illustrates an example flowchart of a method 800 of determining RC Pair calibration. Method 800 can include ACTS 805-830. The method 800 can be performed, for example, by one or more component of system 400 depicted in FIG. 4, including, for example, the data processing system 405. At ACT 805, hybrid pulse power characterization (HPPC) and constant current data is acquired. At ACT 810, data is processed. At ACT 815, RC equation and temperature factor are preset. At ACT 820, optimization function is setup. At ACT 825, optimal value is determined. At ACT 830, RC Pair look up table is generated.

At ACT 805, hybrid pulse power characterization (HPPC) and constant current data is acquired. Paralleled connected RC pairs represent the transient dynamics with different time constants, which is obtained by a curve fitting (optimization) process to best fit the simulated terminal voltage curve to the experimentally measured one.

At ACT 810, data is processed. The data used for the calibration of resistors (Rx) and capacitors (Cx) of the RC Pairs in the EQC battery model 415 can be obtained by HPPC tests and CC tests in order to cover the dynamic response of battery cells 120, battery modules 115 or battery packs 110 with various time constant. The data can include the time, current, voltage and temperature information. The data can be collected within the full SOC, temperature, and current ranges, and can be combined as the input to the global calibration function.

At ACT 815, RC equation and temperature factor are preset. Under the framework of global calibration methodology, the Rx and Cx parameters of the RC pairs at reference temperature (T0) can be expressed as quartic equations of SOCs in order to provide a smoothed function of SOC. Rx and Cx parameters can be expressed as functions having linear SOC component along with a quadratic SOC component. The Rx and Cx parameter functions can also include an SOC component to the power of four and/or the SOC component to the power of six. The Rx and Cx SOC functions can be combined and expressed a matrix (matrix A). Temperature effects on the Rx, Cx parameters can be governed by Arrhenius equation. In the Arrhenius equation the Rx resistance inputs (e.g., R1, R2, R3) and Cx capacitance inputs (e.g., C1, C2, C3) can be expressed as R and C at T0 which can denote a reference temperature multiplied by an exponential component that is dependent on SOC. The Rx and Cx temperature effect functions can be expressed as a matrix (matrix B).

At ACT 820, optimization function is setup. At this stage, the calibration of RC pairs can become an optimization problem to find optimal matrix A and B that minimizes the terminal voltage error between simulation and measurement. The setup of the optimization function can include a cost function that can be formulated as a root mean square error between the simulation and experimental measurement Vt 545 terminal voltage. Initial random value can be entered for matrix A input and an initial random value input can be entered for matrix B input. Constraints can be set for upper and lower conditions for the resistances and capacitance, such as between 0.0001 Ohm and 0.1 Ohm for resistance or 0.0001 F and 0.1 F for capacitance At ACT 825, optimal value is determined. Using sequential quadratic programming, input variables can be modified for matrices A and B to determine outputs for functions with different inputs. The process can include a maximum iteration limit and step tolerance to ensure that the loop does not run indefinitely. Then, out of all the results, the process can identify the result that corresponds to the minimal Vt error between the function and the experimental measurement of the Vt 545.

At ACT 830, RC pair look up table is generated. The output results or results can be compiled into a RC pair look up table to be input into an EQC battery model 415 parameter set at step 640 of the method 600. Then, the process can continue to model accuracy evaluation at ACT 645 of the method 600.

Figure 9A:
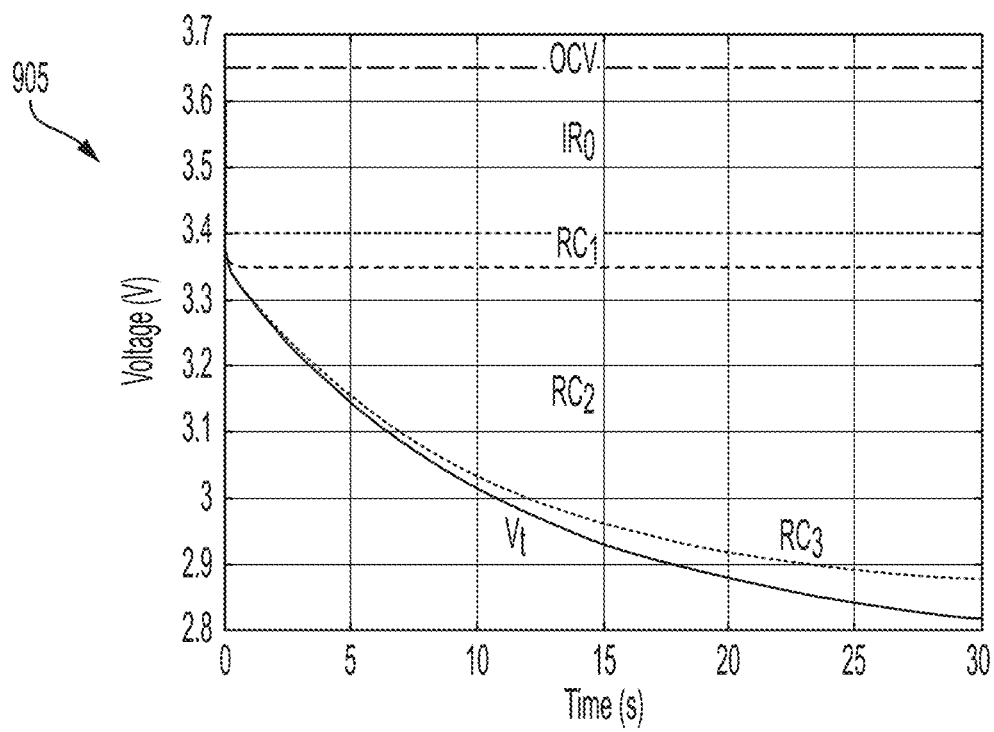
FIGS. 9A, 9B and 9C (referred herein also as "FIG. 9") depict graphs illustrating overpotential analysis and percentage of voltage drops of different parameters over time of an example model of an electric vehicle.
Figure 9B:
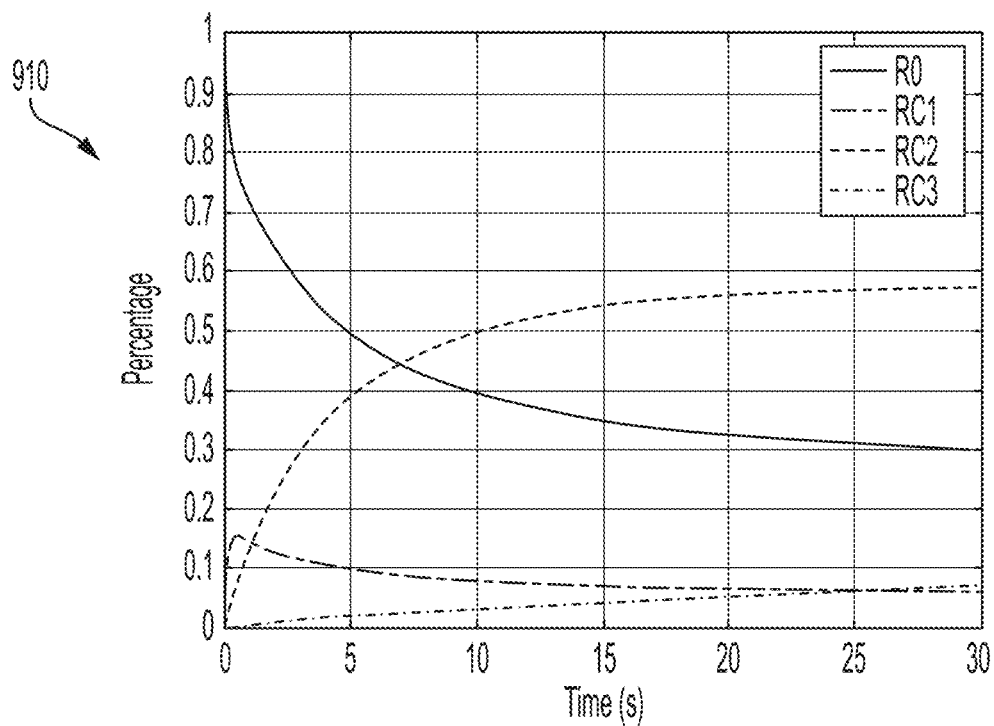
Figure 9C:
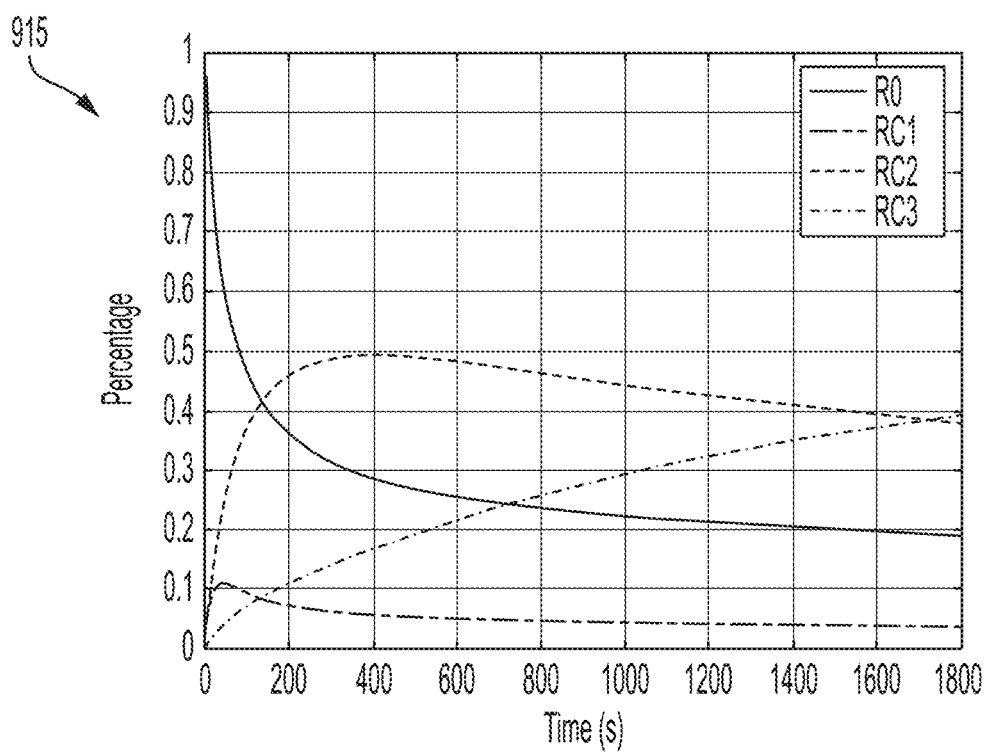

FIG. 9 depicts graphs 905, 910 and 915 showing overpotential analysis and percentage of voltage drops of different parameters 420 over time of an example EQC model 415 of an electric vehicle 105. Graph 905 shows decomposition of the terminal voltage (V5 545) simulated at a constant discharge current. The simulation can be performed using a calibrated EQC model at 50% SOC at room temperature. The OCV 505 can be the voltage between the battery's positive and negative terminals at equilibrium state. The total overpotential can be the difference between the terminal voltage Vt 545 and OCV 505 and can be decomposed into those for R0 510 and RC pairs (RC 522, RC 532 and RC 542).

The overpotential caused by R0 510 can be a fixed value and can be proportional to the applied current. The overpotential due to different RC pairs (e.g., 522, 532 and 542) can vary at different time steps, and can be governed by the values of each parameters and the time constants.

Graphs 910 and 915 show percentage of voltage drops of R0 510 and RC pairs (e.g., 522, 532 and 542) over the total overpotential at different time scales. As shown in the graph 910, during the first ~2 s after discharge, the voltage drop caused by R0 510 and RC 522 (e.g., RC1) dominates the overall overpotential. Then, after about 7 seconds, the voltage drop by RC 532 (e.g., RC2) becomes a significant factor. Then, as more clearly seen in graph 915, voltage drop caused by RC 542 (e.g., RC3) gradually increases as the discharge continues, and eventually becomes dominant after about a half an hour. The results of overpotential analysis can reflect that each component (e.g., parameter 420) in the EQC battery model 415 can contribute to the total overpotential at different time scales. Thus, in order to fully capture the characteristics of each parameter 420 in the model, experimental data at different time scales can be used to account for the changes through time. As a result, continuous and differentiable (e.g., smooth) functions can be used as parameter values 425.

Figure 10:
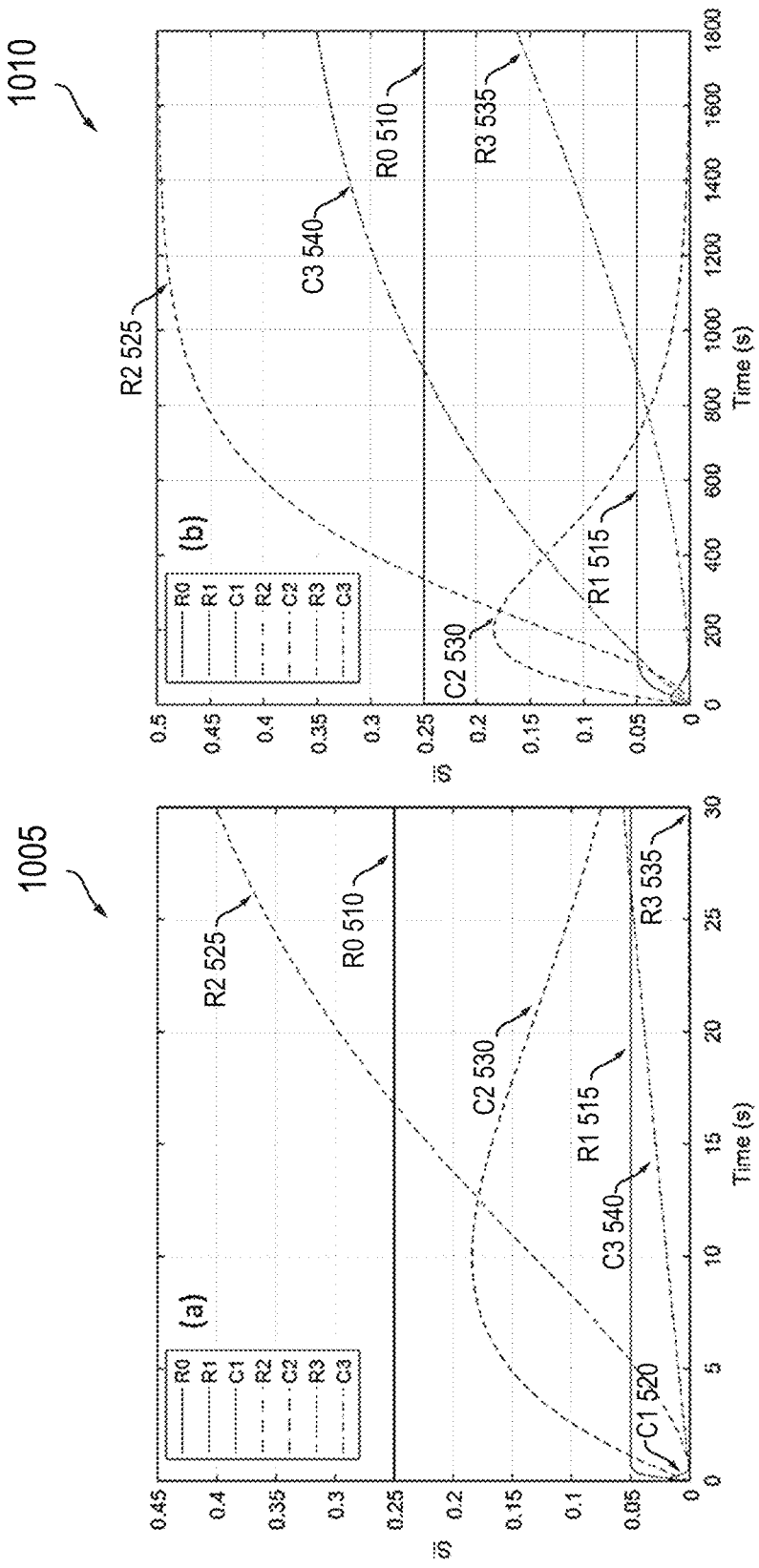
FIG. 10 depicts graphs of parameter sensitivity analysis over time of an example model of an electric vehicle.

FIG. 10 depicts graphs 1005 and 1010 illustrating sensitivity analysis of parameters 420 over time of an example EQC battery model 415 of an electric vehicle 105. The sensitivity variables of each parameter 420 at different time scales are shown in graphs 1005 and 1010. Results show the sensitivity of each parameter 420 as it can vary at different time intervals. For example, R0 510 can be the most sensitive parameter in the first 17 s after the discharge of the battery (e.g., 110, 115 or 120). The sensitivity of R1 515 can increase during the first one second, and can then keep a constant with the value of 0.05. Meanwhile, the sensitivity of C1 520 can reach a peak at ~0.5 seconds and then decrease to be negligible. The sensitivity of R2 525 can increase at discharge and become the most sensitive parameter after 350 seconds. The sensitivity of C2 530 can increase at the beginning of discharge, reach a peak at 10 seconds, and then decrease. The sensitivity of R3 525 and C3 540 can be negligible in the first 30 seconds of discharge, but they increase as the cell is discharged. C3 540 can become the second significant parameter after about 900 seconds.

The results of parameter sensitivity analysis illustrated in graphs 1005 and 1010 show that each parameter 420 in the EQC battery model 415 can have a different impact on the terminal voltage Vt 545, and therefore can become identifiable at different time scale. Thus, the experimental data at different time scales can be used to calibrate the parameters 420 using functions over a broad range of inputs.

Figure 11:
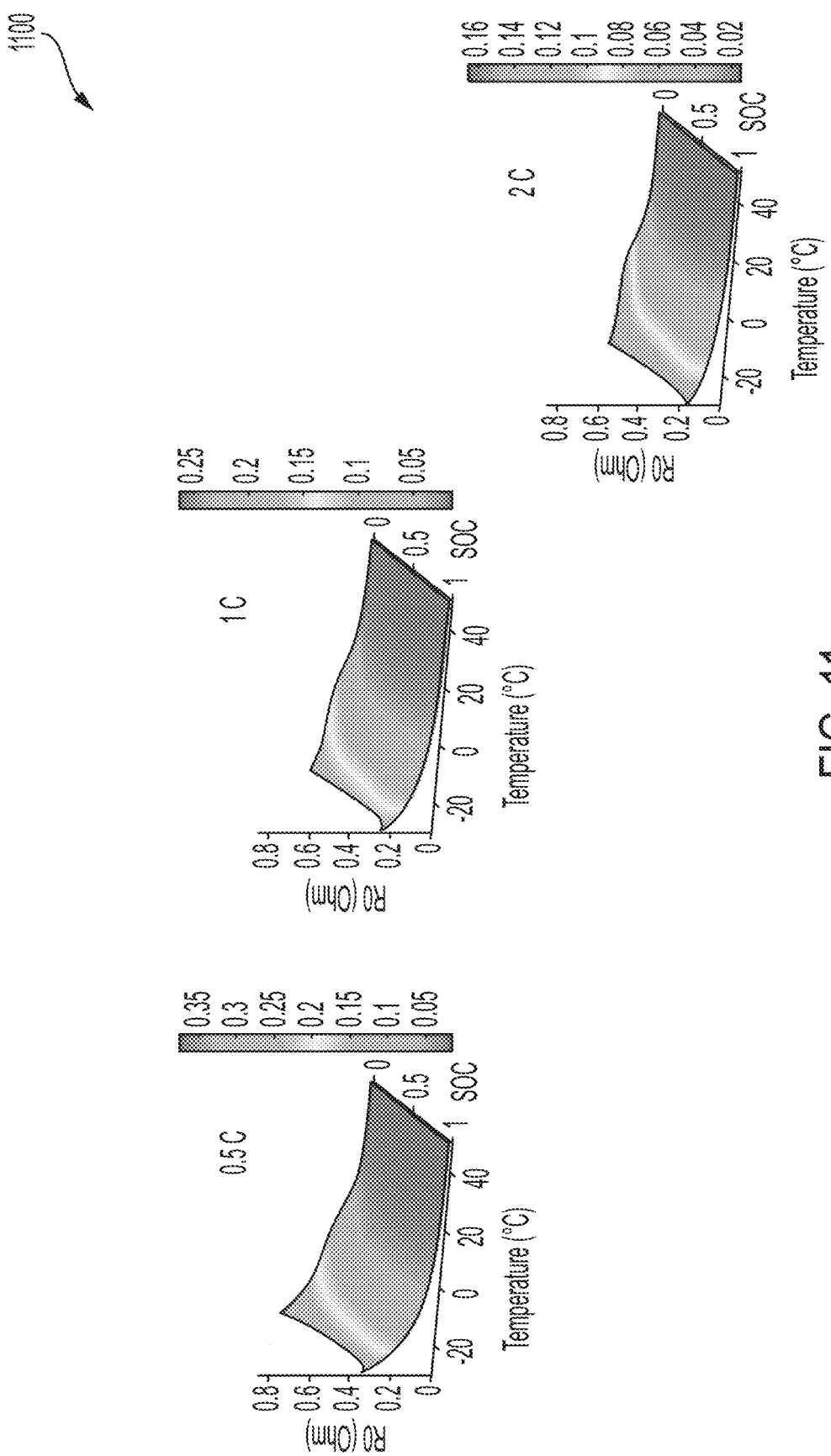
FIG. 11 depicts graphs of calibrated mapping of an $R_0$ parameter of an example model of an electric vehicle.

FIG. 11 depicts graphs 1100 of calibrated mapping of an R0 510 parameter 420 of an example EQC battery model 415 of an electric vehicle 105. The graphs show a plot of R0 510 as a function of temperature and SOC.

Figure 12A:
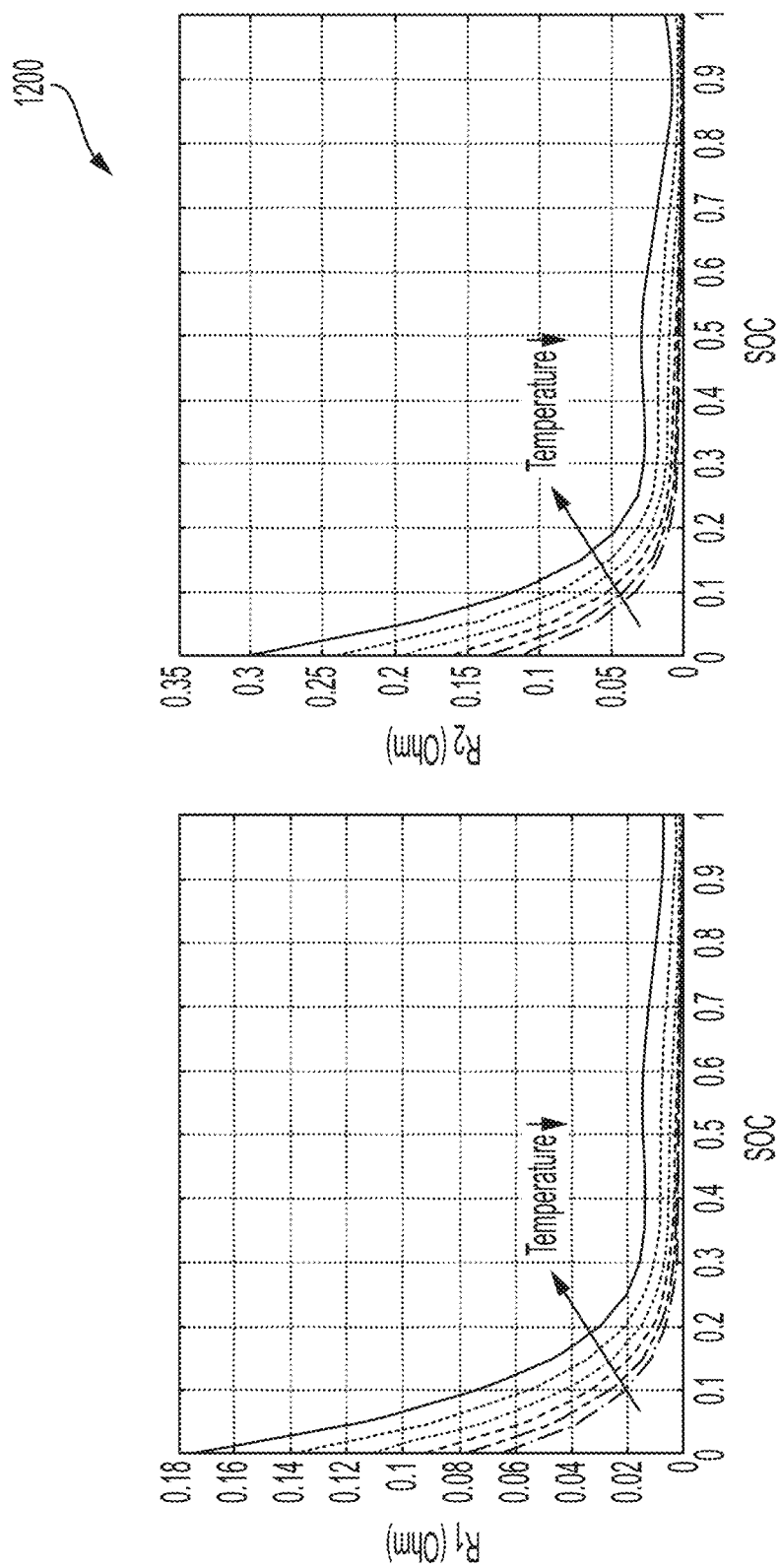

FIG. 12 depicts graphs 1200 of calibrated Rx parameters 420 and RC Pair parameters 420 of an example EQC model 415 of an electric vehicle. Rx values can correspond to R values, such as R1 515, R 525 and R 535. RC pairs can correspond to RC 522, RC 532 and RC 542. The top row of three figures can show, from left to right, plots of resistances of R1 515, R2 525 and R3 535 as a function of SOC for each of those resistances. Each of the plots can include several curves, corresponding to several different temperatures of that particular resistance.

The second row can correspond to $tau_x$ values where $tau_x$ can represent a time constant for each RC pair. As such, the bottom row of three figures can show, from left to right, plots of tau x of each of the RC pairs, starting from RC 522, then RC 532 and then RC 542 at the end. As with the plots in the top row, each of the plots can include several curves that can correspond to several different temperatures of that particular RC pair.

Figure 13:
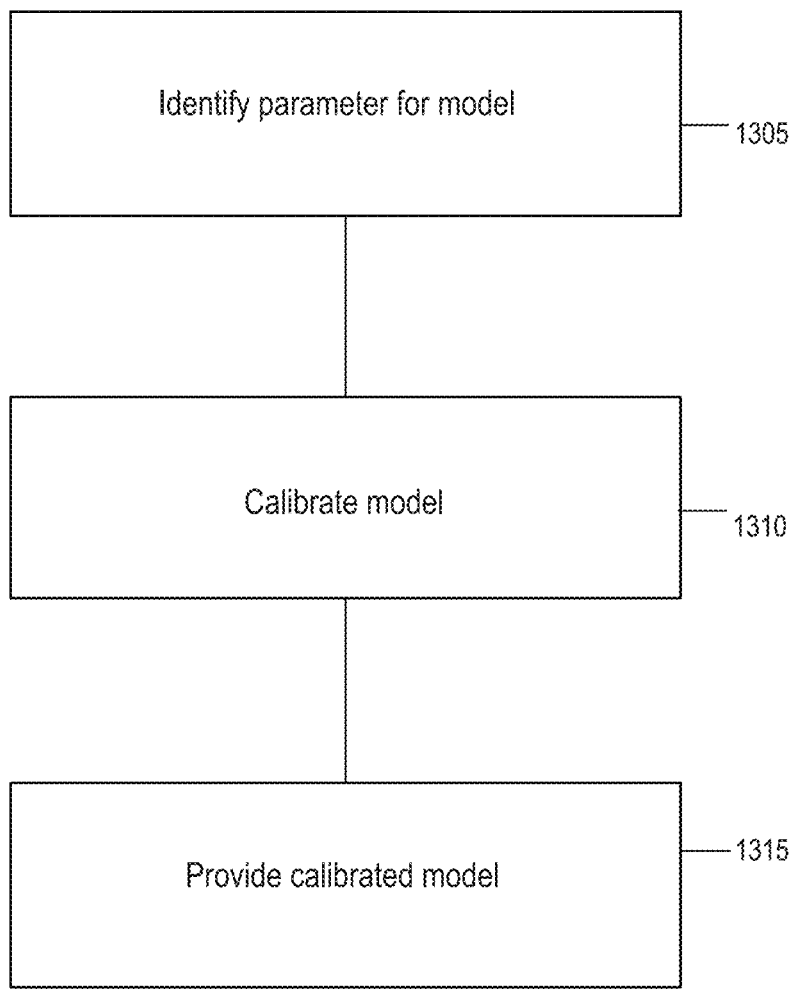
FIG. 13 is a flow diagram of an example method of implementing a global calibration calibrated model in an electric vehicle using, for example, the system depicted in FIG. 4.

FIG. 13 is a flow diagram of an example method for operating a global calibration calibrated model in an electric vehicle using the system features described in FIGS. 1-12. Method 1300 can include ACTS 1305-1315. At ACT 1305, the method identifies parameter for model. At ACT 1310, the method calibrates model. At ACT 1315, the method provides calibrated model.

At ACT 1305, the method identifies parameter for model. Data processing system can use one or more processors coupled with memory to identify a parameter of a model. The parameter of the model can be used to determine a performance of a battery via the model. The data processing system can identify, based on a data set, a plurality of parameters of the model. The model can include an equivalent circuit model. The parameter can include a resistance. The parameter can include a capacitance. The parameter can include a series of resistance and capacitance, such as resistance and capacitance combinations. For example, the parameter can include one or more resistances or resistors connected in parallel with one or more capacitances or capacitors. For example, the parameter can include one or more resistances or resistors connected in series with one or more capacitances or capacitors.

Data processing system can rank, based on the data set, the plurality of parameters of the model based on an impact of the plurality of parameters on an output of the model. Ranking can be done based on sensitivity of parameters. Ranking can be done based on overpotential of parameters. Overpotential can be different for different time intervals. Data processing system can select, based on the rank of the plurality of parameters, the parameter. The parameter can include a resistance. The function can output outputs a value of the resistance based on a state of charge, a temperature, and an applied current. The function can be a function for determining values of parameters, e.g., parameter function.

At ACT 1310, the method calibrates model. Data processing system can calibrate the model based on a function (e.g., parameter function) that generates values for the parameter of the model across a range of states of charges and a range of temperatures. The function can include a smooth function, or a differential function, with a continuous derivative across the range of states of charges and the range of temperatures. Data processing system can establish the function based on a neural network model. The function established can output a value for the parameter based on a state of charge, a temperature, and an applied current. Data processing system can calibrate the model based on the function. A second function can generate values for a second parameter of the model across the range of states of charges and the range of temperatures. The second parameter can include a series of resistance and capacitance. The second parameter can include one or more resistances and one or more capacitances connected in parallel.

The data processing system can generate a set of functions for a first matrix of parameters based on a dependence of state of charge and a second matrix of parameters based on a dependence of temperature. Data processing system can generate, based on the set of functions for the first matrix, a third matrix of parameters that fit a data set generated from a test of the battery. The data set can include time, current, terminal voltage, and temperature measured for the battery via one or more sensors. The parameter can include a series of resistance and capacitance. The method can include the data processor generating a set of functions for a first matrix of parameters based on a dependence of state of charge and a second matrix of parameters based on a dependence of temperature. The data processing system can generate, based on the set of functions for at least one of the first matrix or the second matrix, a third matrix of parameters that fit a data set generated from a test of the battery. The data set can include time, current, terminal voltage, and temperature measured for the battery via one or more sensors. Data processing system can select the parameter based on the second matrix of parameter that fit the data set. Data processing system can evaluate an accuracy of the model. Data processing system can provide the model for use in an electric vehicle responsive to the accuracy satisfying a threshold.

The data processing system can identify, via one or more processors, values of the parameter of the model across a range of states of charges and a range of temperatures. For example, a data processing system can identify a plurality of values of the parameter of the model according to a range of states of charges of a battery. The range of states of charges can correspond to a range of measurements of states of charges of a battery or a range of determinations corresponding to states of charges of the battery. The range of temperatures can correspond to a range of temperatures for various states of charges of the battery. For example, the range of temperatures can include any temperature range including external ambient temperature and/or maximum operating temperature of the battery.

At ACT 1315, the method provides calibrated model. Data processing system can provide the model calibrated for the battery to cause the model to determine the performance responsive to input. Data processing system can provide the calibrated battery model to the electric vehicle via network interfaces of the data processing system and electric vehicle. Data processing system can send the calibrated battery model to the electric vehicle via a network. Data processing system can receive a non-calibrated battery model via networking interfaces of the data processing system and the electric vehicle, via a network, and then upon calibrating the battery model, the data processing system can send the calibrated battery model to the electric vehicle, via the network and the network interfaces.

Some of the description herein emphasizes the structural independence of the aspects of the system components or groupings of operations and responsibilities of these system components. Other groupings that execute similar overall operations are within the scope of the present application. Modules can be implemented in hardware or as computer instructions on a non-transient computer readable storage medium, and modules can be distributed across various hardware or computer based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

For example, descriptions of positive and negative electrical characteristics may be reversed. Further relative parallel, perpendicular, vertical or other positioning or orientation descriptions include variations within +/−10% or +/−10 degrees of pure vertical, parallel or perpendicular positioning. References to "approximately," "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A system, comprising:
one or more processors coupled with memory to:
identify, for the electric vehicle, a model configured based on a function to determine electrical performance of a battery, wherein:
  i) the function identifies a range of states of charges and a range of temperatures;
  ii) the function outputs values for a parameter of the model based on the range of states of charges and the range of temperatures; and
  iii) the model is established for the values for the parameter output by the function;
generate, based on input from a sensor, a value of electrical performance via the model; and
perform, based on the value of the performance, an action to generate an instruction to control power delivered from the battery of the electric vehicle.

2. The system of claim 1, comprising the one or more processors to:
generate the value of electrical performance comprising at least one of a state of charge of the battery of an electric vehicle, a state of power of the battery, or a state of energy; and
wherein the action comprises providing the value of the electrical performance via a graphical user element viewable on display device of the electric vehicle.

3. The system of claim 1, wherein:
the input from the sensor corresponds to an amount of charge stored in the battery and the action comprises the one or more processors to provide an instruction to charge the battery.

4. The system of claim 1, comprising:
the one or more processors to provide the action including the one or more processors generating the instruction to limit the power output from the battery to a set level.

5. The system of claim 1, comprising:
the one or more processors to receive the model from a data processing system remote from the electric vehicle, wherein the data processing system calibrates the model based on the function that generates the values for the parameter of the model across the range of states of charges and the range of temperatures.

6. The system of claim 1, wherein the model comprises an equivalent circuit model and the parameter corresponds to a component of the equivalent circuit model having one of a resistance or a combination of the resistance and a capacitance of the equivalent circuit model.

7. The system of claim 1, comprising the one or more processors to:
receive from the sensor data corresponding to a temperature of the battery; and
generate the value of electrical performance responsive to the temperature of the battery.

8. A method, comprising:
identifying, by one or more processors coupled with memory, a parameter of a model that determines an electrical performance of a battery;
identifying, by the one or more processors, values of the parameter of the model across a range of states of charges and a range of temperatures;
calibrating, by the one or more processors, the model based on a function that generates the values for the parameter of the model;
causing, by the one or more processors in response to input from a sensor, the model calibrated for the battery to determine the electrical performance to display; and
performing, based on the electrical performance, an action to generate an instruction to control power delivered from the battery of the electric vehicle.

9. The method of claim 8, wherein the function comprises a continuous derivative across the range of states of charges and the range of temperatures.

10. The method of claim 8, comprising:
identifying, by the data processing system based on a data set, a plurality of parameters of the model;
ranking, by the data processing system based on the data set, the plurality of parameters of the model based on an impact of the plurality of parameters on an output of the model; and selecting, by the data processing system based on the rank of the plurality of parameters, the parameter.

11. The method of claim 8, wherein the model comprises an equivalent circuit model.

12. The method of claim 8, wherein the parameter corresponds to a component of the equivalent circuit model having one of a resistance or a combination of the resistance and a capacitance of the equivalent circuit model.

13. The method of claim 8, comprising:
receiving, by the one or more processors from a sensor of an electric vehicle, data corresponding to a temperature of the battery; and
generating, by the one or more processors, the value of performance responsive to the temperature of the battery.

14. The method of claim 8, wherein the parameter comprises a resistance, and the function outputs a value of the resistance based on a state of charge, a temperature, and an applied current.

15. The method of claim 8, comprising:
establishing, by the data processing system, the function via a neural network model, the function established to output a value for the parameter based on a state of charge, a temperature, and an applied current.

16. The method of claim 8, wherein the parameter comprises a resistance, comprising:
calibrating, by the data processing system, the model based on the function and a second function that generates values for a second parameter of the model across the range of states of charges and the range of temperatures, the second parameter comprising a series of resistance and capacitance.

17. The method of claim 8, wherein the parameter comprises a series of resistance and capacitance, comprising:
generating, by the data processing system, a set of functions for a first matrix of parameters based on a dependence of state of charge and temperature;
generating, by the data processing system based on the set of functions for the first matrix, a second matrix of parameters that fit a data set generated from a test of the battery, the data set comprising time, current, terminal voltage, and temperature measured for the battery via one or more sensors; and
selecting, by the data processing system, the parameter based on the second matrix of parameter that fit the data set.

18. The method of claim 8, comprising:
evaluating, by the data processing system, an accuracy of the model; and
providing, by the data processing system, the model for use in an electric vehicle responsive to the accuracy satisfying a threshold.

19. A non-transitory computer-readable medium comprising instructions that, when executed by one or more processors, cause the one or more processors to:
identify a parameter of a model that determines a performance of a battery via the model;
identify values of the parameter of the model across a range of states of charges and a range of temperatures;
calibrate the model based on a function that generates values for the parameter of the model across a range of states of charges and a range of temperatures;
cause the model calibrated for the battery to determine the performance to display, responsive to input from a sensor; and
perform, based on the performance, an action to generate an instruction to control power delivered from the battery of the electric vehicle.

20. The non-transitory computer-readable medium of claim 19, wherein the function comprises a smooth function with a continuous derivative across the range of states of charges and the range of temperatures.

* * * * *